United States Patent
Takahashi

(10) Patent No.: US 8,564,378 B2
(45) Date of Patent: Oct. 22, 2013

(54) VOLTAGE-CONTROLLED OSCILLATING CIRCUIT AND CRYSTAL OSCILLATOR

(75) Inventor: Yutaka Takahashi, Sayama (JP)

(73) Assignee: Nihon Dempa Kogyo Co., Ltd., Tokyo (JP)

(*) Notice: Subject to any disclaimer, the term of this patent is extended or adjusted under 35 U.S.C. 154(b) by 22 days.

(21) Appl. No.: 13/424,283

(22) Filed: Mar. 19, 2012

(65) Prior Publication Data

US 2012/0242418 A1 Sep. 27, 2012

(30) Foreign Application Priority Data

Mar. 24, 2011 (JP) ................................. 2011-065818
Feb. 2, 2012 (JP) ................................. 2012-020854

(51) Int. Cl.
*H03B 5/36* (2006.01)
(52) U.S. Cl.
USPC ......... 331/161; 331/160; 331/177 V; 331/109
(58) Field of Classification Search
USPC ............................. 331/158, 160, 109, 177 V
See application file for complete search history.

(56) References Cited

U.S. PATENT DOCUMENTS

| | | | | |
|---|---|---|---|---|
| 3,979,693 A | * | 9/1976 | Saari | 331/61 |
| 5,646,580 A | * | 7/1997 | Perkins | 331/116 R |
| 6,198,359 B1 | * | 3/2001 | Wichern | 331/117 R |
| 6,215,367 B1 | * | 4/2001 | Blaud et al. | 331/105 |
| 7,088,188 B2 | * | 8/2006 | Fredriksson | 331/46 |
| 7,375,600 B2 | * | 5/2008 | Karthaus | 331/158 |
| 7,400,209 B2 | * | 7/2008 | Veenstra et al. | 331/177 V |
| 7,501,907 B1 | * | 3/2009 | Teo | 331/117 R |
| 2007/0008047 A1 | * | 1/2007 | Karthaus | 331/158 |
| 2007/0018742 A1 | * | 1/2007 | Shanbhag et al. | 331/177 V |
| 2012/0242418 A1 | * | 9/2012 | Takahashi | 331/109 |

FOREIGN PATENT DOCUMENTS

JP 03-230605 A 10/1991
JP 2001-156545 A 6/2001

* cited by examiner

*Primary Examiner* — Joseph Chang
(74) *Attorney, Agent, or Firm* — Knobbe Martens Olson & Bear LLP

(57) ABSTRACT

A voltage-controlled oscillating circuit includes a differential amplifying circuit connected to a resonant element such as a quartz crystal element. The differential amplifying circuit includes first and second input terminals connected to the resonant element and also connected respectively to first and second voltage-controlled capacitors. The differential output terminals of the differential amplifying circuit are connected respectively to first and second emitter follower circuits. The output signal of the first emitter follower circuit is fed back to the second input terminal through a third capacitor and a third voltage-controlled capacitor, and the output signal of the second emitter follower circuit is fed back to the second input terminal through a fourth capacitor and a fourth voltage-controlled capacitor. A control voltage is applied to each of the voltage-controlled capacitors.

9 Claims, 16 Drawing Sheets

US 8,564,378 B2

VOLTAGE-CONTROLLED OSCILLATING CIRCUIT AND CRYSTAL OSCILLATOR

BACKGROUND OF THE INVENTION

1. Field of the Invention

The present invention relates to an oscillating circuit including a resonant element such as a piezoelectric resonator, for example, connected between the differential input terminals of a differential amplifying circuit, and more particularly to a voltage-controlled oscillating circuit which is capable of controlling an oscillation frequency with an external input voltage, and a quartz crystal oscillator incorporating such a voltage-controlled oscillating circuit.

2. Description of the Related Art

Various electronic devices include oscillating circuits. As electronic devices are being scaled down in size, efforts have widely been made to construct oscillating circuits on integrated circuits (ICs). Since it is possible to easily integrate many circuit components such as transistors, resistors, and capacitors in integrated circuits, low-noise oscillating circuits may be constructed by adopting, as a circuit configuration of oscillating circuits, a differential type configuration which has a high power supply noise suppression capability.

An oscillating circuit of a differential type includes a resonant element for determining an oscillation frequency and a differential amplifying circuit connected to the resonant element. The resonant element may be a mechanical resonator or an LC (inductor-capacitor) resonant circuit in addition to a piezoelectric resonator typified by a quartz crystal resonator, i.e., a crystal element or crystal unit.

JP3-230605A discloses an oscillating circuit of a differential type including a differential amplifying circuit which has a pair of bipolar transistors and a resonant element such as a crystal element which is connected between the bases of the bipolar transistors. FIG. 1 shows the oscillating circuit of the differential type disclosed in JP3-230605A.

As shown in FIG. 1, transistors 31, 32 have respective emitters connected in common to a junction that is connected to ground through current source 37. Transistors 31, 32 have collectors respectively supplied with power supply voltage Vcc through load resistors 35a, 35b. Resonant element 21 has an end connected to the base of transistor 31 and the other end connected to the base of transistor 32. Feedback capacitor 33a is connected between the base of transistor 32 and the collector of transistor 31, and feedback capacitor 34a is connected between the base of transistor 31 and the collector of transistor 32. In FIG. 1, capacitors 33b, 34b that are disposed between respective transistors 31, 32 and ground are parasitic feedback capacitors. Power supply voltage Vcc is applied to bias circuit 36, which supplies base bias voltages to the bases of transistors 31, 32 via bias resistors 38a, 38b, respectively. A pair of differential oscillating output signals Lo, /Lo are obtained from the respective collectors of transistors 32, 31.

Since the oscillating circuit shown in FIG. 1 is capable of providing a large loop gain by the differential amplifying circuit, the oscillating circuit is advantageous in that it has a high oscillation start-up capability with low power consumption, or stated otherwise, it has a large negative resistance.

Even if a crystal element or the like is used as resonant element 21, the user may find it desirable to change the oscillation frequency depending on a control voltage supplied from an external circuit. An oscillating circuit which can control its oscillation frequency depending on a control voltage supplied from an external circuit is called a voltage-controlled oscillating (VCO) circuit. It can easily be understood that a voltage-controlled oscillating circuit having a wide variable frequency range is realized by replacing parasitic feedback capacitors 33b, 34b in the circuit shown in FIG. 1 with voltage-controlled variable capacitors.

FIG. 2 shows an example of a voltage-controlled oscillating circuit constructed base on the oscillating circuit shown in FIG. 1. As shown in FIG. 2, transistors Q1, Q2 have respective emitters connected in common to a junction that is connected to ground through current source I1. Transistors Q1, Q2 have collectors respectively supplied with power supply voltage Vcc through load resistors (i.e., collector resistors) R1, R2. Resonant element 21 has an end connected to the base of transistor Q1 through node X1 and the other end connected to the base of transistor Q2 through node X2. Nodes X1, X2 are connected to respective ends of voltage-controlled variable capacitors VC1, VC2, whose other ends are supplied with control voltage Vcont. Therefore, nodes X1, X2 serve as junctions through which variable capacitors VC1, VC2 are connected to resonant element 21, and the bases of transistors Q1, Q2 are connected respectively to nodes X1, X2. Feedback capacitor C1 is connected between node X1 and the collector of transistor Q2, and feedback capacitor C2 is connected between node X2 and the collector of transistor Q1. Bias resistors R3, R4 are connected to respective nodes X1, X2. Bias voltage Vb is applied through bias resistors R3, R4 to the bases of transistors Q1, Q2. Differential buffer amplifier 22 which amplifies the voltage difference between nodes X1, X2 supplies a pair of differential output signals to output terminals OUTPUT.

The voltage-controlled oscillating circuit shown in FIG. 2 can oscillate at frequencies in a wide variable frequency range depending on control voltage Vcont applied to variable capacitors VC1, VC2. However, the oscillating circuit is problematic in that the loop characteristics change greatly depending on the capacitance values of variable capacitors VC1, VC2. Changes in the loop characteristics of the oscillating circuit will be described below with reference to FIG. 3.

FIG. 3 shows loop characteristics in a frequency band in the vicinity of 75 MHz at the time the capacitance values of variable capacitors VC1, VC2 change in a range from 2 pF to 10 pF in the circuit shown in FIG. 2 where a crystal element having a resonant oscillation frequency of 75 MHz is used as resonant element 21. In FIG. 3, curves G1 to G4 represent gain characteristics, and curves P1 to P4 phase characteristics. Curves G1, P1 represent gain and phase characteristics, respectively, at the time the capacitance values of variable capacitors VC1, VC2 are 2 pF each. Curves G2, P2 represent gain and phase characteristics, respectively, at the time the capacitance values of variable capacitors VC1, VC2 are 3 pF each. Curves G3, P3 represent gain and phase characteristics, respectively, at the time the capacitance values of variable capacitors VC1, VC2 are 6 pF. Curves G4, P4 represent gain and phase characteristics, respectively, at the time the capacitance values of variable capacitors VC1, VC2 are 10 pF. The frequency at which the gain is 0 dB or higher and the phase is 0° is an oscillation frequency, and the gain at the frequency represents a loop gain in an oscillating state. As the characteristic curves change more steeply with respect to frequencies, the Q factor of the circuit is greater.

It can be said from FIG. 3 that when the capacitance values of variable capacitors VC1, VC2 change, the loop gain and the Q factor of the circuit vary. Specifically, as the variable capacitances are smaller, i.e., as the oscillation frequency is higher, the loop gain is higher, and the Q factor of the circuit is lower at the same time. A comparison between characteristic curves G1, G4 indicates that characteristic curve G1 is less steep than characteristic curves G4 with respect to frequency changes, and characteristic curve P1 is less steep than characteristic curves P4 with respect to frequency changes, which means a reduction in the Q factor with smaller capacitance values.

Changes in the loop gain and the Q factor affect the characteristics of the voltage-controlled oscillating circuit. Specifically, changes in the loop gain cause the negative resistance to vary, which means that the start-up characteristics of the oscillating circuit are different depending on the control voltage Vcont applied to the voltage-controlled variable capacitors. Reductions in the Q factor of the circuit invite deteriorations of the phase noise.

In particular, it is general practice for voltage-controlled oscillating circuits of the type described to have a differential amplifying circuit and variable capacitors included in an integrated circuit (IC) chip and also to have a resonant element such as a crystal element connected as an external component to the IC chip. It is up to the user to decide on what type of resonant element and what resonant frequency are to be used depending on the purpose of the oscillating circuit. However, it is preferable to use IC chips of one type in combination with resonant elements of different types and different resonant frequencies in view of cost and inventory management. When resonant elements of different types and different resonant frequencies are connected to IC chips of one type, however, the problems of varying start-up characteristics and deteriorating Q factor may possibly be aggravated depending on the resonant elements connected.

It is possible to construct a voltage-controlled oscillating circuit as a package component to be mounted on a wiring board or a circuit board. For example, quartz crystal oscillators which have a crystal element as a resonant element and an IC chip including a differential amplifying circuit and a variable capacitor, all housed in one casing, are widely used in portable devices such as mobile phones because such crystal oscillators can easily be scaled down. The IC chip may incorporate a temperature compensation circuit for compensating for changes in the temperature vs. frequency characteristics of the crystal element.

JP2001-156545A discloses an oscillating circuit including a differential amplifying circuit which has a pair of bipolar transistors and an LC resonant circuit connected between the collectors of the transistors.

SUMMARY OF THE INVENTION

As described above, in the voltage-controlled oscillating circuits including a differential amplifying circuit according to the related art, loop characteristics of the circuit tend to vary depending on the control voltage applied thereto, and start-up characteristics and phase noise are adversely affected by such varying loop characteristics.

It is an object of the present invention to provide a voltage-controlled oscillating circuit which is suitable for being constructed on an integrated circuit, has a wide variable frequency range, produces low phase noise, and can match resonant elements of different types and different resonant frequencies.

Another object of the present invention to provide a crystal oscillator which has a wide variable frequency range, produces low phase noise, and can match various oscillation frequencies.

According to the present invention, there is provided a voltage-controlled oscillating circuit for being connected to a resonant element, comprising: a first node and a second node for being connected respectively to opposite ends of the resonant element; a differential amplifying circuit including first and second input terminals, which constitute a pair of differential input terminals, and first and second output terminals, which constitute a pair of differential output terminals; first and second voltage-controlled variable capacitors connected respectively to the first node and the second node; first and second load capacitors connected respectively to the first and second output terminals; first and second follower circuits, such as emitter follower circuits, connected respectively to the first and second output terminals; a first feedback capacitor and a third voltage-controlled variable capacitor which are connected in series to an output terminal of the first follower circuit; and a second feedback capacitor and a fourth voltage-controlled variable capacitor which are connected in series to an output terminal of the second follower circuit, wherein the first and second nodes are connected respectively to the first and second input terminals, an output signal of the first follower circuit is fed back to said second node through the first feedback capacitor and the third voltage-controlled variable capacitor, an output signal of the second follower circuit is fed back to said first node through the second feedback capacitor and the fourth voltage-controlled variable capacitor, and a control voltage is applied to the first to fourth voltage-controlled variable capacitors.

According to the present invention, there is also provided a crystal oscillator comprising a crystal element, an IC chip connected to the crystal element, and a casing housing the crystal element and the IC chip therein, wherein the IC chip includes at least a voltage-controlled oscillating circuit integrated therein which is connected to the crystal element, and the voltage-controlled oscillating circuit comprises: first and second nodes connected respectively to opposite ends of the resonant element; a differential amplifying circuit including first and second input terminals, which constitute a pair of differential input terminals, and first and second output terminals, which constitute a pair of differential output terminals; first and second voltage-controlled variable capacitors connected respectively to the first node and the second node; first and second load capacitors connected respectively to the first and second output terminals; first and second follower circuits connected respectively to the first and second output terminals; a first feedback capacitor and a third voltage-controlled variable capacitor which are connected in series to an output terminal of the first follower circuit; and a second feedback capacitor and a fourth voltage-controlled variable capacitor which are connected in series to an output terminal of the second follower circuit, wherein the first and second nodes are connected respectively to the first and second input terminals, the output signal of the first follower circuit supplies is fed back to said second node through the first feedback capacitor and the third voltage-controlled variable capacitor, the output signal of the second follower circuit is fed back to said first node through the second feedback capacitor and the fourth voltage-controlled variable capacitor, and a control voltage is applied to the first through fourth voltage-controlled variable capacitors.

With the voltage-controlled oscillating circuit according to the present invention, the first and second voltage-controlled capacitors are connected respectively to the first and second input terminals of the differential amplifying circuit, and the follower circuits, such as emitter follower circuits, are connected respectively to the first and second output terminals of the differential amplifying circuit. An output signal from one of the follower circuits is fed back to the differential amplifying circuit through the third voltage-controlled variable capacitor, and an output signal from the other follower circuit is fed bask to the differential amplifying circuit through the fourth voltage-controlled variable capacitor. In this manner, the loop characteristics of the differential amplifying circuit are kept constant regardless of changes in the control voltage, good characteristics of the voltage-controlled oscillating circuit including start-up characteristics and phase noise are thus maintained. Since the loop characteristics of the differential amplifying circuit are also kept well regardless of the characteristics of the resonant element, the voltage-controlled oscillating circuit is compatible with resonant elements of different types and different resonant frequencies.

DETAILED DESCRIPTION OF THE EMBODIMENTS

Figure 1:
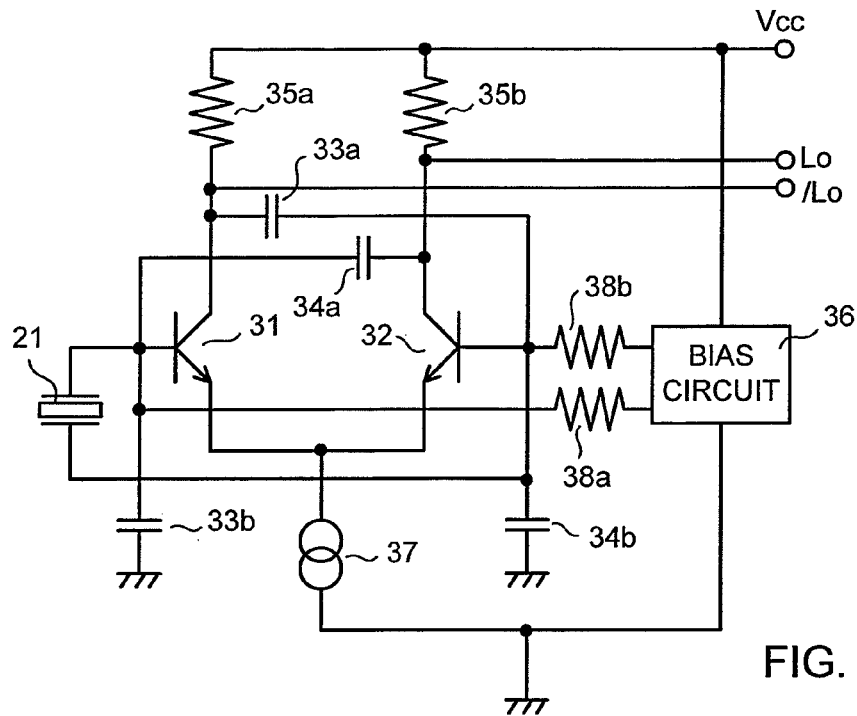
FIG. 1 is a circuit diagram showing an example of configuration of an oscillating circuit including a differential amplifying circuit according to the related art.

Like or corresponding parts are denoted by like or corresponding reference characters throughout views.

Prior to describing voltage-controlled oscillating circuits according to exemplary embodiments of the present invention, reasons, as analyzed by the inventor, why the loop gain of the voltage-controlled oscillating circuits according to the related art varies depending on the control voltage will be described below. In the voltage-controlled oscillating circuit shown in FIG. 2, the output signals from the differential amplifying circuit including transistors Q1, Q2, i.e., the output signals from the collectors of transistors Q1, Q2, are fed back as signals whose voltages are divided by voltage dividing circuits having capacitors C1, C2 and variable capacitors VC1, VC2 to the input terminals of the differential amplifying circuit, i.e., the bases of transistors Q1, Q2. When the capacitance values of variable capacitors VC1, VC2 change, the levels of the fed-back signals also change, resulting in a variation in the loop gain.

Figure 4:
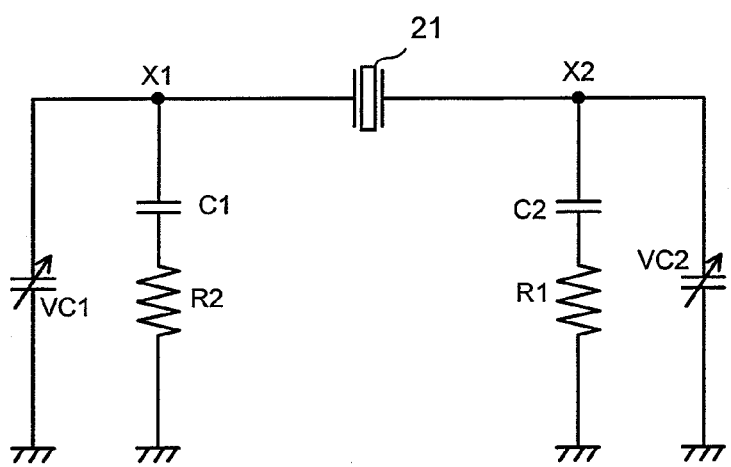
FIG. 4 is a circuit diagram of an AC equivalent circuit of the circuit shown in FIG. 2 with feedback paths removed therefrom.

Reasons, as analyzed by the inventor, why the Q factor of the voltage-controlled oscillating circuits according to the related art is lowered depending on the control voltage will be described below. FIG. 4 is a circuit diagram of an AC equivalent circuit of the circuit shown in FIG. 2 wherein there are no feedback paths to transistors Q1, Q2, i.e., there are no transistors Q1, Q2. It is assumed that bias resistors R3, R4 shown in FIG. 2 are negligible as they are sufficiently larger than load resistors R1, R2 of the differential amplifying circuit.

If it is assumed that the Q factor of resonant element 21 is infinite ($\infty$) for illustrative purposes. If the resistance values of load resistors R1, R2 are nil, then the Q factor of the entire circuit shown in FIG. 2 is infinite, making the oscillating circuit ideal. Actually, however, since load resistors R1, R2 have finite resistance values, the Q factor is lowered. Inasmuch as the resistance values of load resistors R1, R2 and the capacitance values of capacitors C1, C2 of the circuit shown in FIG. 2 do not change, the Q factor is smaller as the capacitance values of variable capacitors VC1, VC2 are smaller in view of the effect that load resistors R1, R2 have on the Q factor. As described above with reference to FIG. 3, therefore, the Q factor of the circuit is lowered when the capacitance values of variable capacitors VC1, VC2 are smaller, i.e., when the oscillating circuit is oscillated at higher frequencies.

Figure 2:
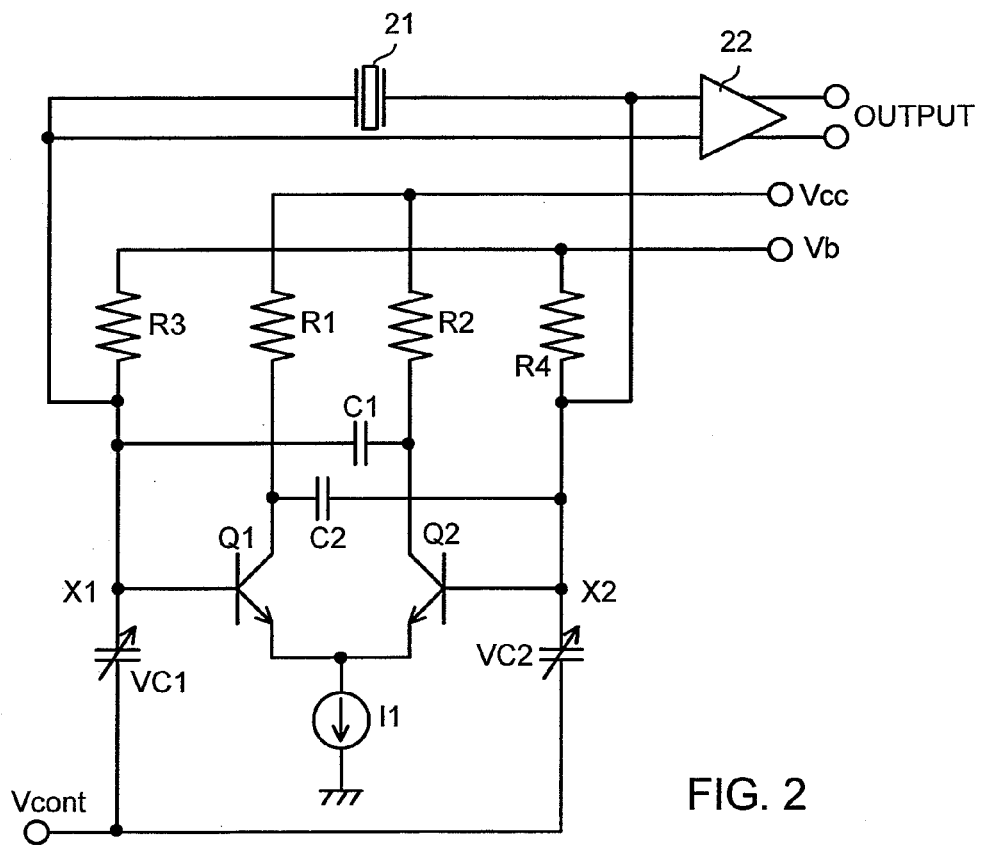
FIG. 2 is a circuit diagram showing an example of configuration of a voltage-controlled oscillating circuit constructed base on the oscillating circuit shown in FIG. 1.
Figure 3:
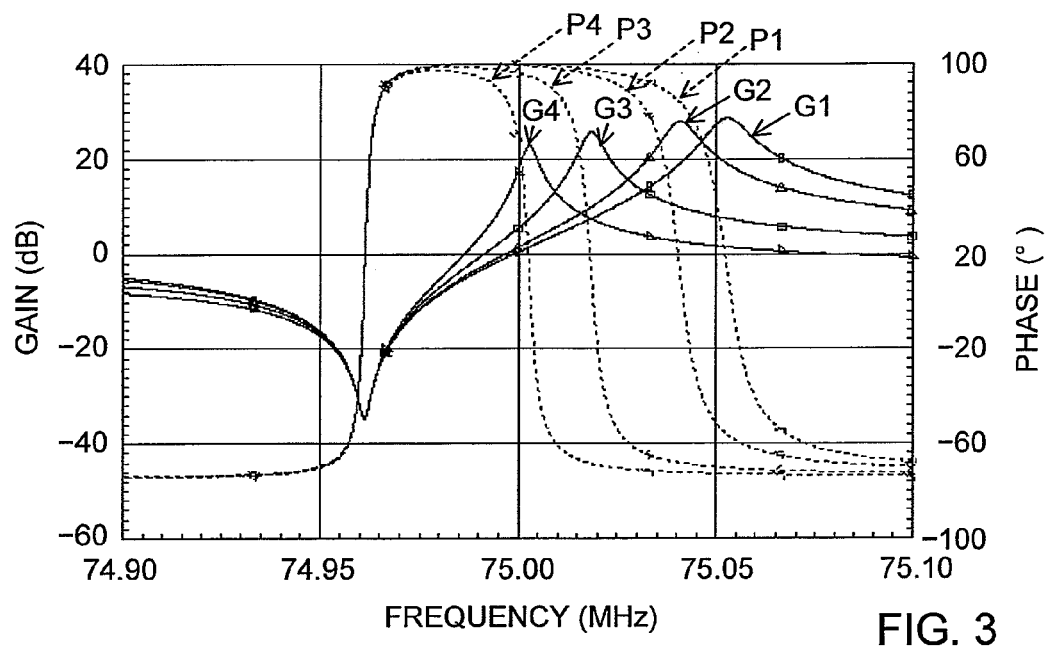
FIG. 3 is a graph showing the loop characteristics of the circuit shown in FIG. 2.

Based on the above analysis, if the loop gain is to remain unchanged despite changes in the control voltage in the circuit shown in FIG. 2, then it can be seen that capacitors C1, C2 should comprise variable capacitors and their capacitance values should change at the same rate as variable capacitors VC1, VC2 depending on the control voltage. In order to prevent the Q factor from being lowered, the output impedance of the differential amplifying circuit may be made nearly nil, and an emitter follower circuit, for example, may be added to the differential amplifying circuit. However, simply adding an emitter follower circuit is not effective to keep the oscillating circuit oscillating well because it fails to meet the requirement that the signal phase be rotated through 360° (=0°) at the frequency for the maximum loop gain.

In view of the above results of the analysis, the inventor proposes voltage-controlled oscillating circuits according to exemplary embodiments described below as voltage-controlled oscillating circuits which are capable of keeping themselves oscillating well.

Figure 5:
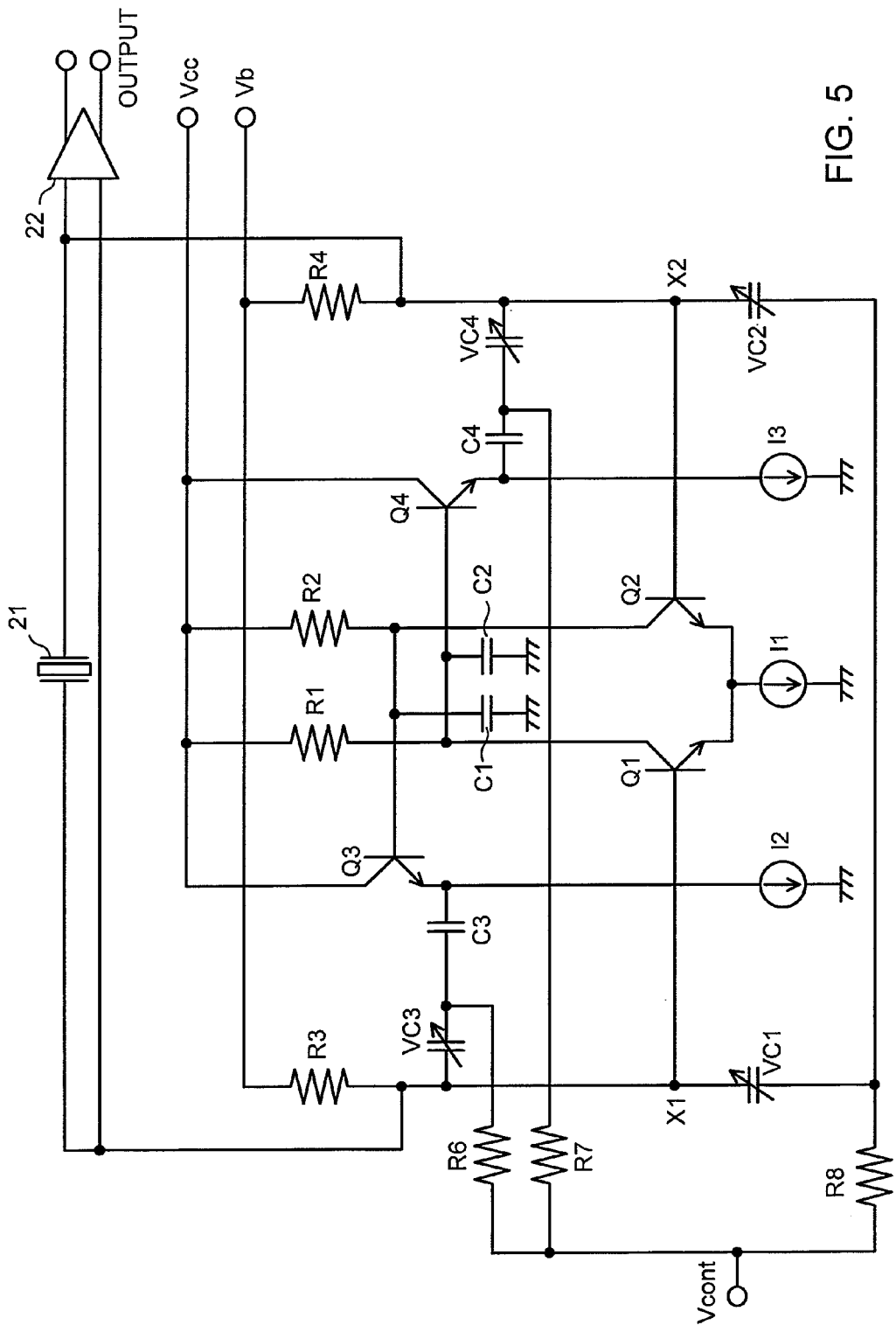
FIG. 5 is a circuit diagram showing configuration of a voltage-controlled oscillating circuit according to a first exemplary embodiment of the present invention.

FIG. 5 illustrates a configuration of a voltage-controlled oscillating circuit according to a first exemplary embodiment of the present invention. The circuit shown in FIG. 5 is different from the voltage-controlled oscillating circuit shown in FIG. 2 in that it additionally has two emitter follower circuits comprising transistors Q3, Q4 and current sources I2, I3 for keeping the Q factor high regardless of control voltage Vcont, and the loop gain is made constant regardless of control voltage Vcont. It has been described above that capacitors C1, C2 should comprise variable capacitors in order to keep the loop gain constant. However, the added emitter follower circuits require series-connected voltage-controlled variable capacitors VC3, VC4 and capacitors C3, C4 to be added in the circuit shown in FIG. 5. Capacitors C3, VC3 serve as capacitors for feeding back a signal to the base of transistor Q1, and capacitors C4, VC4 serve as capacitors for feeding back a signal to the base of transistor Q2.

With the oscillating circuit shown in FIG. 2, load resistors R1, R2 of the differential amplifying circuit and a capacitive load connected to the output terminal of the differential amplifying circuit delay the signal to achieve the condition of signal phase of 0° at a frequency which maximizes the loop gain. The capacitive load comprises capacitors C1, C2 and variable capacitors VC1, VC2. Simply adding emitter follower circuits fails to achieve the condition of the signal phase of 0° at a frequency which maximizes the loop gain. With the oscillating circuit shown in FIG. 5 according to the present exemplary embodiment, capacitor C1 which connects the collector of transistor Q2 to ground, and capacitor C2 which connects the collector of transistor Q1 to ground give a phase rotation to the signal, thereby achieving the condition of signal phase of 0° at a frequency which maximizes the loop gain, as with the circuit shown in FIG. 2 according to the related art.

Details of the voltage-controlled oscillating circuit shown in FIG. 5, particularly those which are added to the circuit shown in FIG. 2, will be described below.

As shown in FIG. 5, transistor Q3 which belongs to one of the emitter follower circuits has a collector connected to power supply voltage Vcc and a base connected to the collector of transistor Q2. Current source I2 is connected between the emitter of transistor Q3 and ground. Capacitor C3 has an end connected to the emitter of transistor Q3 and the other end connected to node X1 through variable capacitor VC3. Similarly, transistor Q4 which belongs to the other emitter follower circuit has a collector connected to power supply voltage Vcc and a base connected to the collector of transistor Q1. Current source I3 is connected between the emitter of transistor Q4 and ground. Capacitor C4 has an end connected to the emitter of transistor Q4 and the other end connected to node X2 through variable capacitor VC4. Control voltage Vcont is applied through resistor R6 to a junction between capacitor C3 and variable capacitor VC3, and also through resistor R7 to a junction between capacitor C4 and variable capacitor VC4. Control voltage Vcont is also applied through resistor R8 to variable capacitors VC1, VC2.

Each of voltage-controlled variable capacitors VC1 through VC4 comprises an element whose capacitance value changes depending on a voltage applied thereto, i.e., an element with a voltage-dependent capacitance value, such as a variable-capacitance diode, a varactor diode, an MOS (Metal-Oxide-Semiconductor) capacitor, or the like. Furthermore, a circuit made up of a plurality of circuit components that are combined to provide a voltage-dependent capacitance value may also be used as each of voltage-controlled variable capacitors VC1 to VC4.

Figure 6:
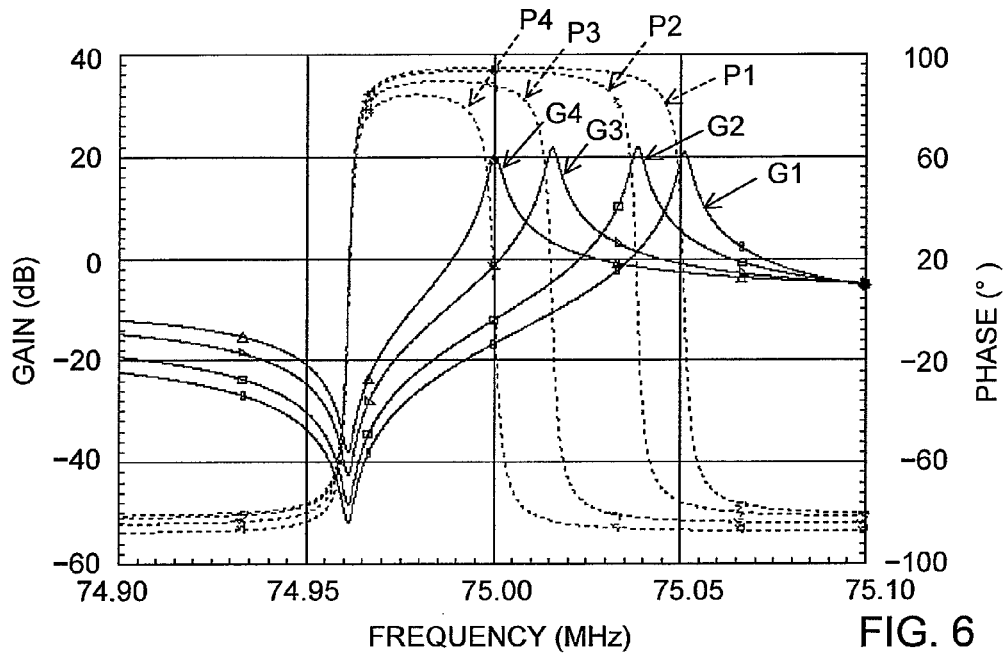
FIG. 6 is a graph showing the improved loop characteristics of the circuit shown in FIG. 5.

FIG. 6 illustrates change in the loop characteristics of the voltage-controlled oscillating circuit shown in FIG. 5 when the oscillation frequency is changed by changing control voltage Vcont under the condition that a crystal element having an oscillation frequency of 75 MHz is used and the capacitance values of voltage-controlled variable capacitors VC1, VC2 are varied in a range from 2 pF to 10 pF to change the oscillation frequency. In FIG. 6, curves G1 to G4 represent gain characteristics, and curves P1 to P4 phase characteristics. Curves G1, P1 represent gain and phase characteristics, respectively, at the time the capacitance values of variable capacitors VC1, VC2 are 2 pF each. Curves G2, P2 represent gain and phase characteristics, respectively, at the time the capacitance values of variable capacitors VC1, VC2 are 3 pF each. Curves G3, P3 represent gain and phase characteristics, respectively, at the time the capacitance values of variable capacitors VC1, VC2 are 6 pF. Curves G4, P4 represent gain and phase characteristics, respectively, at the time the capacitance values of variable capacitors VC1, VC2 are 10 pF.

As shown in FIG. 6, the loop gain of the oscillating circuit shown in FIG. 5 remains essentially unchanged and the Q factor thereof also remains essentially unchanged when the capacitance values of variable capacitors VC1, VC2 are changed depending on control voltage Vcont.

Figure 7:
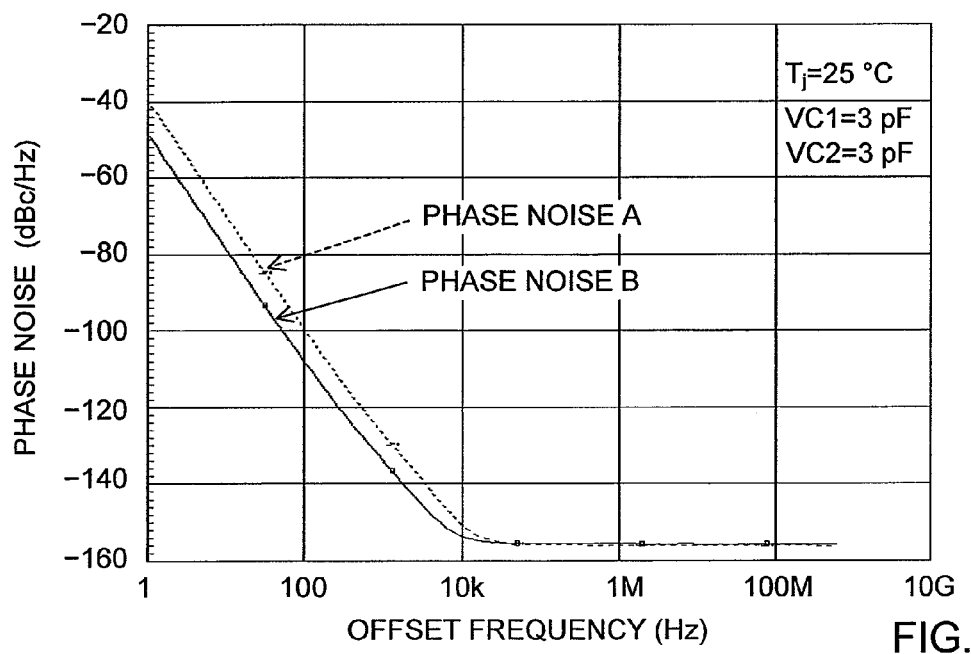
FIG. 7 is a graph showing the improved phase noise characteristics of the circuit shown in FIG. 5.

FIG. 7 is a graph showing, for comparison, the phase noise characteristics of the oscillating circuit shown in FIG. 5 and the oscillating circuit shown in FIG. 2. It is assumed that the junction temperature $T_j$ of each of the semiconductor devices of the oscillating circuits is 25° C. and each of the capacitance values of variable capacitors VC1, VC2 is 3 pF. In FIG. 7, the curve indicated by "PHASE NOISE A" represents the phase noise characteristics of the oscillating circuit shown in FIG. 2 according to the related art, and the indicated by "PHASE NOISE B" represents the phase noise characteristics of the oscillating circuit shown in FIG. 5 according to the present exemplary embodiment. As shown in FIG. 7, the circuit shown in FIG. 5 has its phase noise characteristics improved by about 6 dBc/Hz over the phase noise characteristics of the circuit shown in FIG. 2 according to the related art. The phase noise characteristics is improved because of the improved Q factor. The phase noise of both circuits is constant in an offset frequency range higher than 10 kHz because the phase noise is limited by the thermal noise of circuits in this offset frequency range.

As described above, in the first exemplary embodiment, a voltage-controlled oscillating circuit with a wide variable frequency range and low phase noise is realized.

Figure 8:
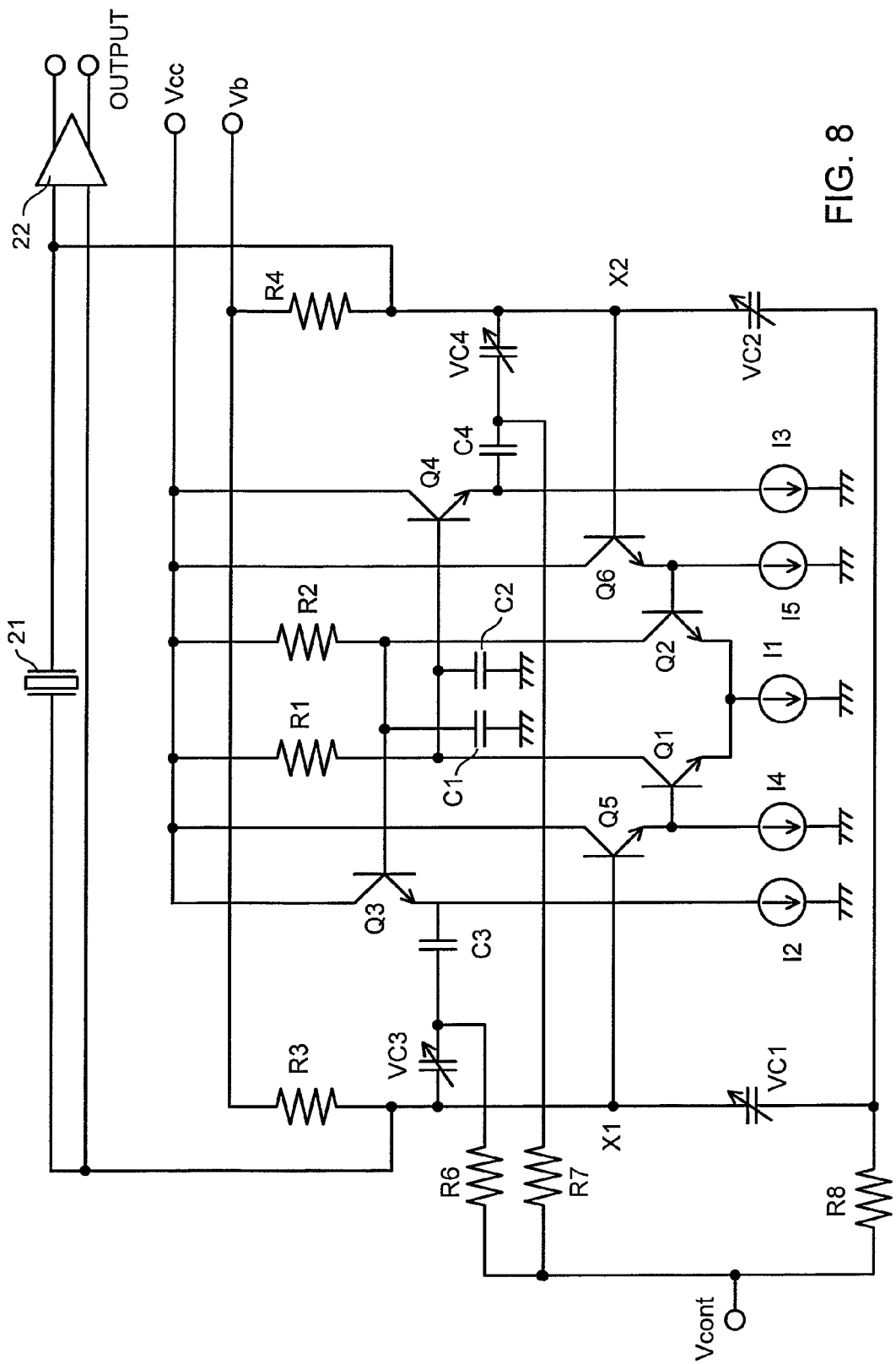
FIG. 8 is a circuit diagram showing configuration of a voltage-controlled oscillating circuit according to a second exemplary embodiment of the present invention.

FIG. 8 illustrates a voltage-controlled oscillating circuit according to a second exemplary embodiment of the present invention. The oscillating circuit shown in FIG. 8 is different from the oscillating circuit shown in FIG. 5 in that it additionally includes emitter follower circuits connected to respective input terminals of the differential amplifying circuit in the oscillating circuit shown in FIG. 5.

Specifically, as shown in FIG. 8, an emitter follower circuit comprising transistor Q5 and current source I4 is connected to the base of transistor Q1. Transistor Q5 has an emitter connected to the base of transistor Q1, and current source I4 is connected between the emitter of transistor Q5 and ground. Transistor Q5 has a base connected to node X1 and a collector connected to power supply Vcc. Similarly, an emitter follower circuit comprising transistor Q6 and current source I5 is connected to the base of transistor Q2. Transistor Q6 has an emitter connected to the base of transistor Q2, and current source I5 is connected between the emitter of transistor Q6 and ground. Transistor Q5 has a base connected to node X2 and a collector connected to power supply Vcc.

When the temperature around the oscillating circuit shown in FIG. 5 according to the first exemplary embodiment increases, the current amplification factor hfe of each of the bipolar transistors decreases, resulting in an increase in the base currents of input transistors Q1, Q2 and a deterioration in the phase noise. In the oscillating circuit shown in FIG. 8 according to the second exemplary embodiment, the emitter follower circuit connected to each of the input terminals of transistors Q1, Q2 is a circuit for preventing the phase noise from being deteriorated at high temperatures. An increase in the base currents of input transistors Q1, Q2 is essentially prevented by transistors Q4, Q5, so that the voltage-controlled oscillating circuit shown in FIG. 5 can prevent the phase noise from being deteriorated.

Figure 9:
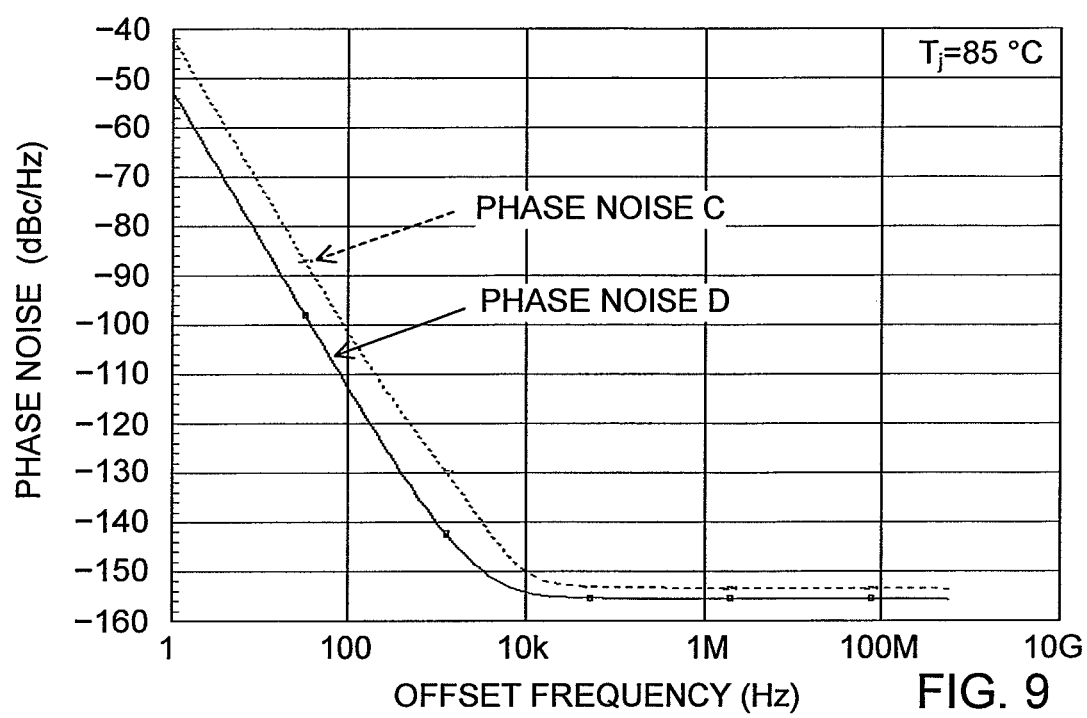
FIG. 9 is a graph showing the improved phase noise characteristics of the circuit shown in FIG. 8.

FIG. 9 is a graph showing, for comparison, the phase noise characteristics of the oscillating circuit shown in FIG. 5 and the oscillating circuit shown in FIG. 8 which is designed for preventing the phase noise from being deteriorated at high temperatures. It is assumed that the junction temperature $T_j$ of each of the semiconductor devices of the oscillating circuits is 85° C. and each of the capacitance values of variable capacitors VC1, VC2 is 3 pF. In FIG. 9, the curve indicated by "PHASE NOISE C" represents the phase noise characteristics of the circuit shown in FIG. 5 according to the first exemplary embodiment, and the indicated by "PHASE NOISE D" represents the phase noise characteristics of the circuit shown in FIG. 8 according to the present exemplary embodiment. It can be understood from FIG. 9 that the added emitter follower circuits improve the phase noise at high temperatures by about 12 dBc/Hz.

Figure 10:
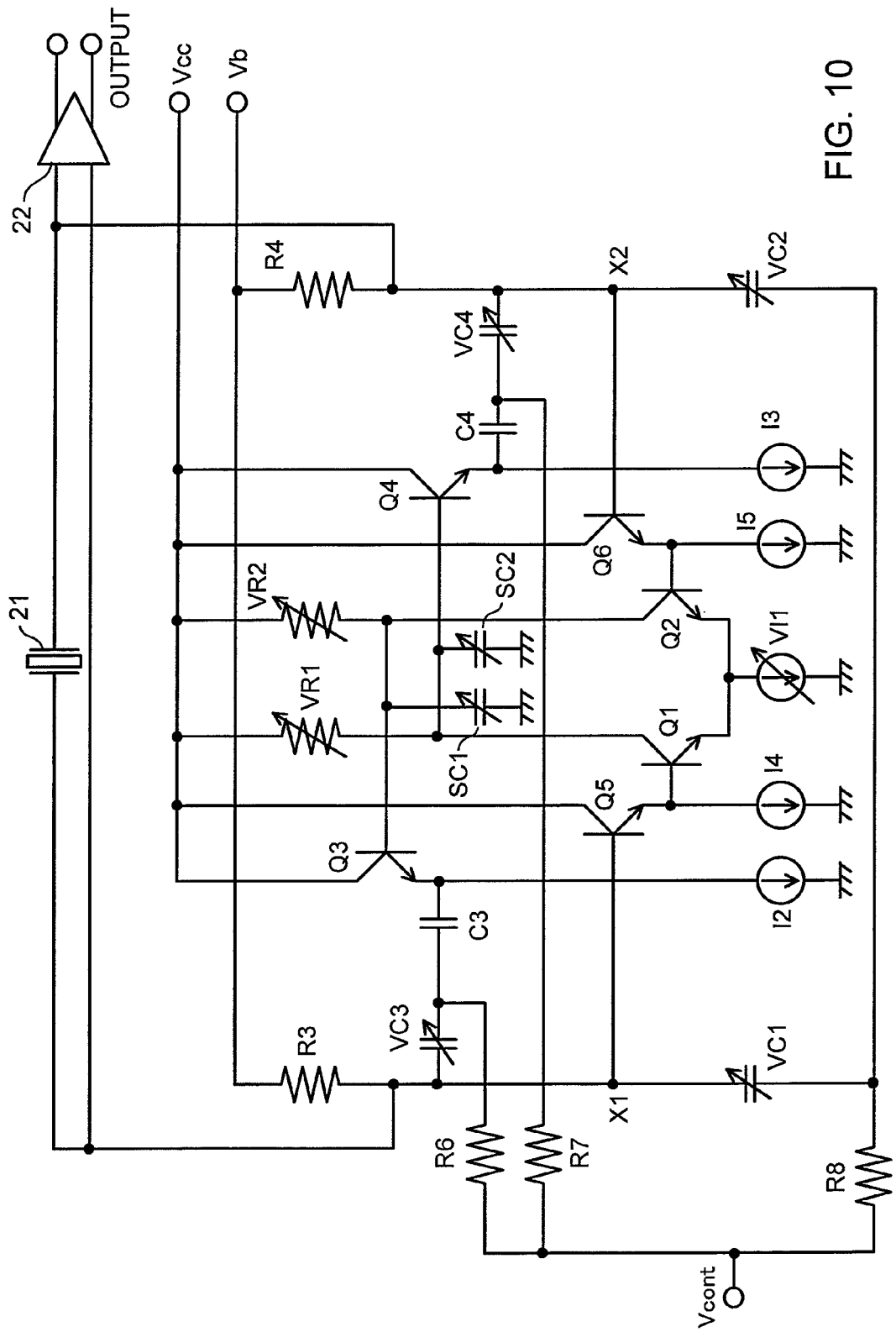
FIG. 10 is a circuit diagram showing configuration of a voltage-controlled oscillating circuit according to a third exemplary embodiment of the present invention.

FIG. 10 illustrates a voltage-controlled oscillating circuit according to a third exemplary embodiment of the present invention.

For constructing voltage-controlled oscillating circuits on integrated circuits (ICs), it is desirable to be able to use resonant elements of different types and different frequencies in voltage-controlled oscillating circuits of one type for various reasons including economical reasons. The oscillating circuit shown in FIG. 10 is similar to the oscillating circuit shown in FIG. 8 except some modifications for making itself compatible with various resonant elements. Specifically, the circuit shown in FIG. 10 includes variable versions of current source I1, load resistors R1, R2, and load capacitors C1, C2 in the circuit shown in FIG. 8. The values of current source I1, load resistors R1, R2, and load capacitors C1, C2 can be adjusted to make the voltage-controlled oscillating circuit compatible with resonant elements of various frequencies. Specifically, the oscillating circuit shown in FIG. 10 includes variable current source VI1 instead of current source I1, variable resistors VR1, VR2 instead of load resistors R1, R2, and variable capacitors SC1, SC2 instead of load capacitors C1, C2.

More specifically, it is assumed that load capacitors SC1, SC2 have respective appropriate capacitance values of 2 pF each when a crystal element having a resonant frequency of 75 MHz is used as resonant element 21. If a crystal element having a vibration frequency of 150 MHz is used as resonant element 21, then it is necessary to double the frequency band of the differential amplifying circuit, with load capacitors SC1, SC2 having respective appropriate capacitance values of 1 pF each.

The same effect can be achieved by variable current source VI1 and variable resistors VR1, VR2. Specifically, the same effect can be achieved by keeping the capacitance values of 2 pF for load capacitors SC1, SC2, doubling the amount of current supplied from current source VI1, and reducing the resistance values of load resistors VR1, VR2 to half. With the values of these circuit components being variable, the voltage-controlled oscillating circuit shown in FIG. 10 according to the third exemplary embodiment is applicable to resonant elements of various types and resonant frequencies.

Figure 11:
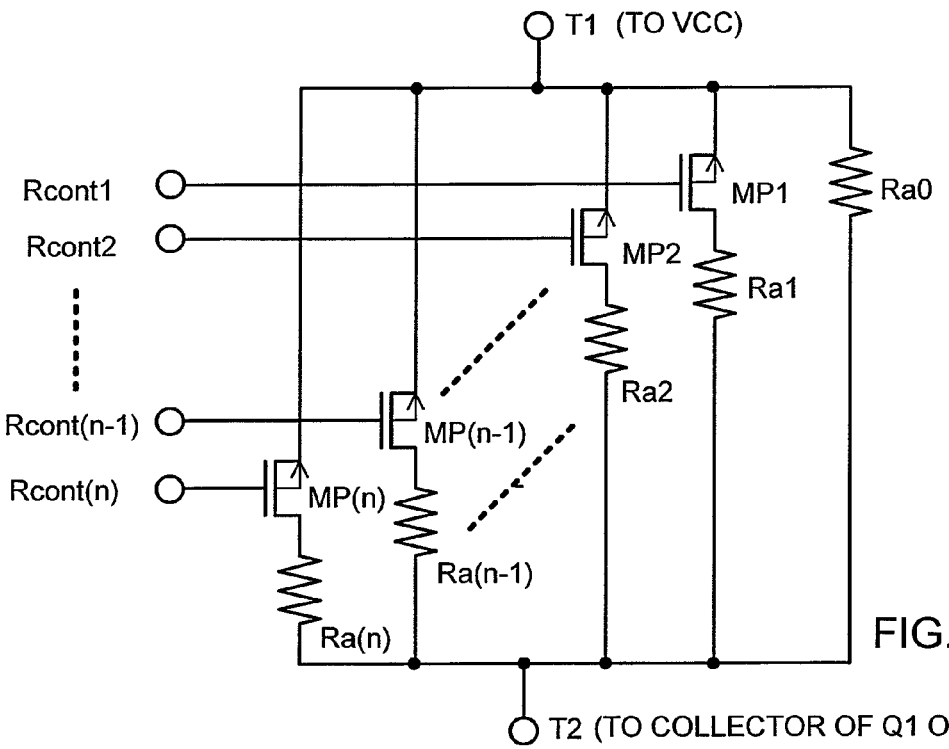
FIG. 11 is a circuit diagram showing an example of configuration of a variable resistor.
Figure 12:
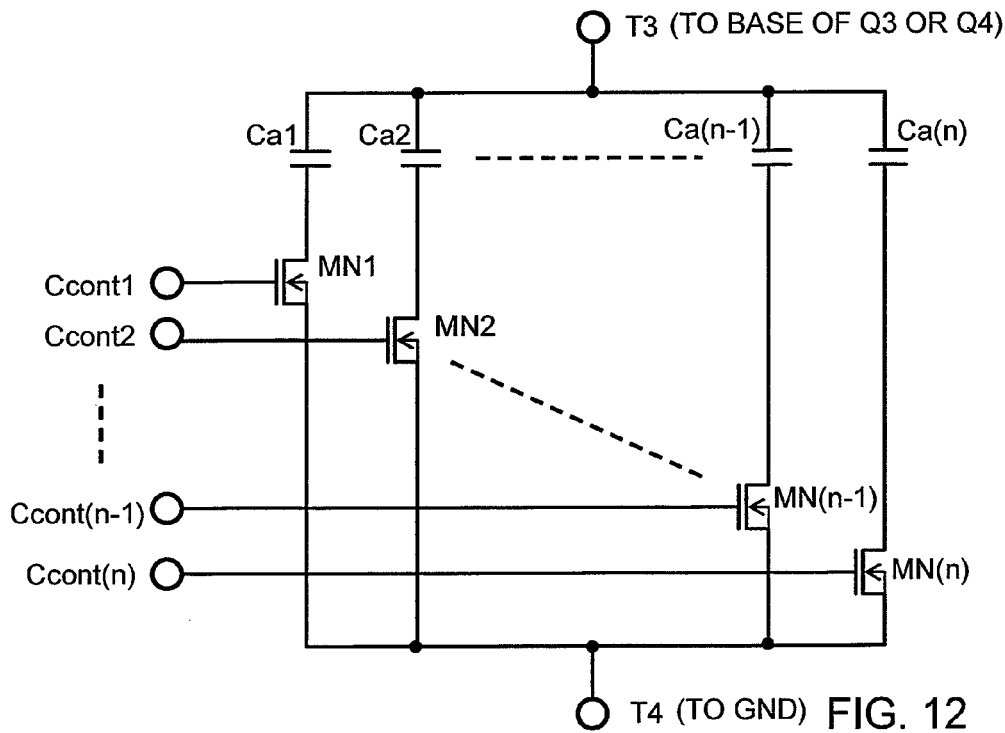
FIG. 12 is a circuit diagram showing an example of configuration of a switched variable capacitor.
Figure 13:
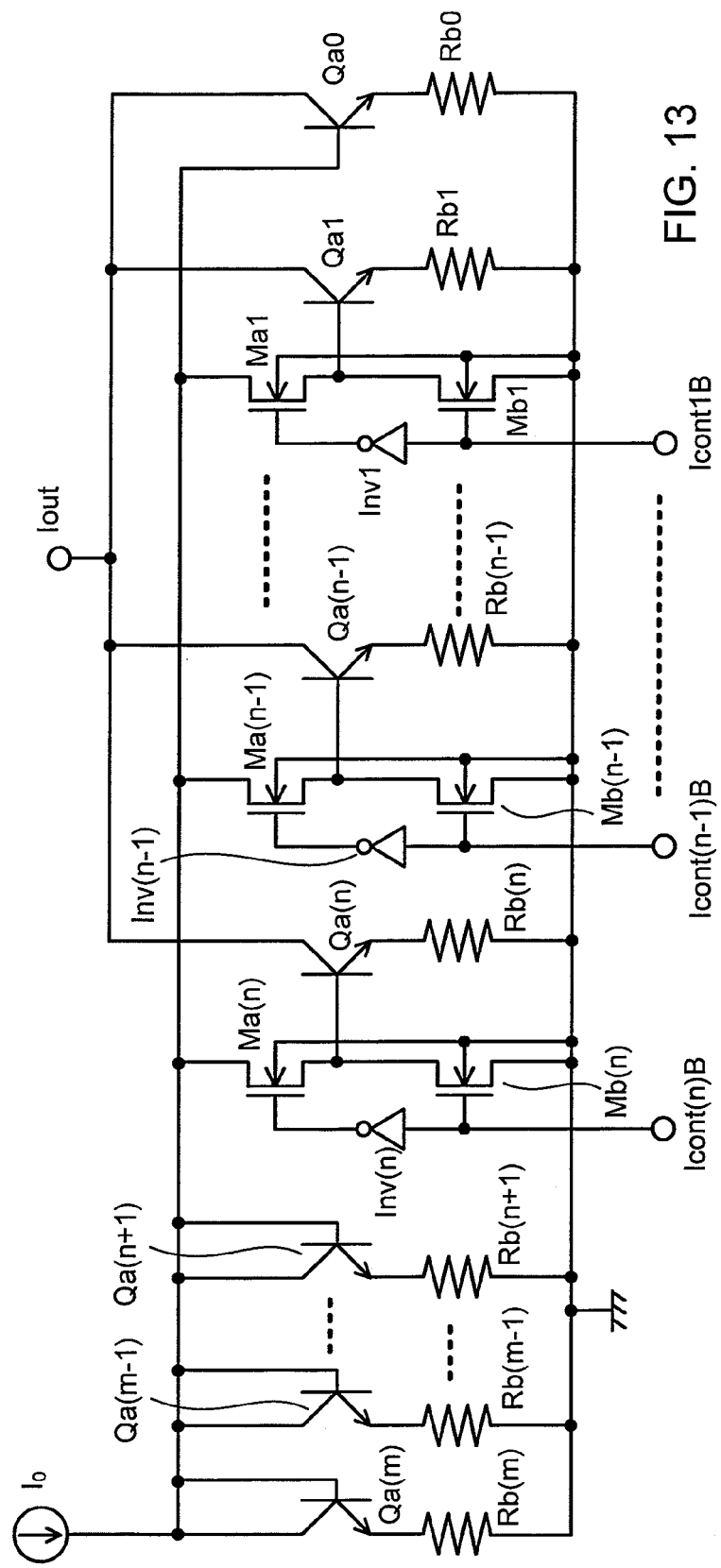
FIG. 13 is a circuit diagram showing an example of configuration of a variable current source.

Specific circuit examples for realizing those circuit components are illustrated in FIGS. 11 to 13. FIG. 11 shows a specific example of configuration of variable load resistors VR1, VR2. FIG. 12 shows a specific example of configuration of variable load capacitors SC1, SC2. FIG. 13 shows a specific example of configuration of variable current source VI1. These variable circuit components have a function to change their component values by inputting logic signals thereto.

The variable load resistor shown in FIG. 11 includes terminal T1 connected to power supply Vcc and terminal T2 connected to the collector of transistor Q1 or Q2. Terminal T1 is connected to an end of resistor Ra0 and the parallel drains of n pieces of P-channel MOSFETs (MOS Field Effect Transistors) MP1 to MP(n). The other end of resistor Ra0 is connected to terminal T2. The sources of transistors MP1 to MP(n) are connected to terminal T2 through resistors Ra1 to Ra(n) respectively. The gates of transistors MP1 to MP(n) are supplied with control signals Rcont1 to Rcont(n), respectively. Therefore, the variable load resistor can have a desired resistance value by controlling the turning-on and -off of transistors MP1 to MP(n) with n control signals Rcont1 to Rcont(n) as logic signals.

The variable load capacitor shown in FIG. 12 is constructed as a switched capacitor, and has terminal T3 connected to the base of transistor Q3 or Q4 and terminal T4 connected to ground. Terminal T4 is connected to the parallel sources of n pieces of N-channel MOSFETs MN1 to MN(n). The drains of transistors MN1 to MN(n) are connected to terminal T3 through capacitors Ca1 to Ca(n), respectively. The gates of transistors MN1 to MN(n) are supplied with control signals Ccont1 to Ccont(n), respectively. The variable load capacitor can have a desired capacitance value by controlling the turning-on and -off of transistors MN1 to MN(n) with n control signals Ccont1 to Ccont(n) as logic signals.

The variable current source shown in FIG. 13 includes: current output terminal Iout; reference current source $I_O$; (m+1) pieces of bipolar transistors Qa0 to Qa(m) entirely making up a current mirror circuit; 2n pieces of M-channel MOS field effect transistors Ma1 to Ma(n), Mb1 to Mb(n); (m+1) pieces of resistors Rb0 to Rb(m); and n pieces of inverters (i.e., logic inverting circuits) Inv1 to Inv(n), where m>n. The emitters of transistors Qa0 to Qa(m) are connected to ground through resistors Rb0 to Rb(m), respectively. The collectors of transistors Qa0 to Qa(m) connected in parallel to each other to current output terminal Iout. The bases and collectors of transistors Qa(n+1) to Qa(m) are connected in common to the output terminal of reference current source $I_O$. The sources of transistors Mb1 to Mb(n) are grounded, the drains of transistors Mb1 to Mb(n) are connected to the sources of transistors Ma1 to Ma(n), respectively. The bases of transistors Qa1 to Qa(n) are connected to the respective junctions between the drains of transistors Mb1 to Mb(n) and the sources of transistors Ma1 to Ma(n). The drains of transistors Ma1 to Ma(n) are connected in common to the output terminal of reference current source $I_O$. The gates of transistors Mb1 to Mb(n) are supplied with control signals Icont1B to Icont(n)B, respectively. The gates of transistors Ma1 to Ma(n) are supplied with control signals Icont1B to Icont(n)B through inverters Inv1 to Inv(n), respectively. The variable current source thus constructed is capable of independently connecting the bases of transistors Qa1 to Qa(n) selectively to ground or the output terminal of reference current source $I_0$ depending on control signals Icont1B to Icont(n)B as logic signals. Since the number of transistors that make up the current mirror circuit can be increased or reduced by controlling the turning-on and -off of control signals Icont1B to Icont(n)B, the circuit arrangement shown in FIG. 13 can function as a variable current source. For reducing the phase noise, the current amplification factors of respective bipolar transistors Qa0 to Qa(m) should preferably be small.

The variable current source shown in FIG. 13 according to the third exemplary embodiment employs variable versions of load resistors R1, R2, current source I1, and load capacitors C1, C2 in the oscillating circuit shown in FIG. 8. In the voltage-controlled oscillating circuit shown in FIG. 5, load resistors R1, R2, current source I1, and load capacitors C1, C2 may similarly be variable components.

Figure 14:
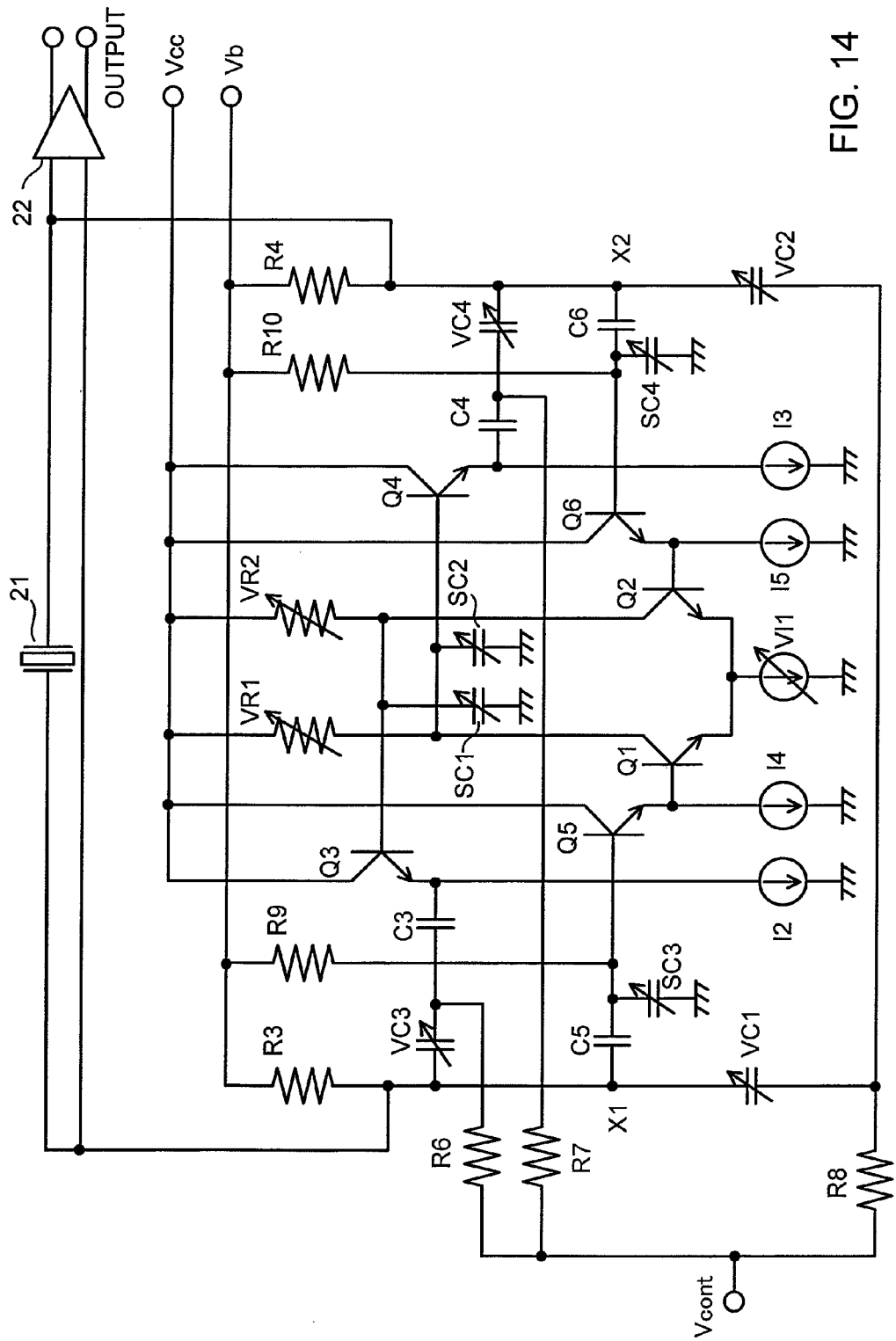
FIG. 14 is a circuit diagram showing configuration of a voltage-controlled oscillating circuit according to a fourth exemplary embodiment of the present invention.

FIG. 14 illustrates a voltage-controlled oscillating circuit according to a fourth exemplary embodiment of the present invention.

The voltage-controlled oscillating circuits according to the above exemplary embodiments can use resonant elements 21 of various types and various different resonant frequencies. However, they may cause trouble if a resonant element 21 with an extremely high Q factor is used. For example, if the resonant frequency of a crystal element used as resonant element 21 is low, e.g., equal to or lower than 10 MHz, then the Q factor of the crystal element itself becomes very high, e.g., $Q=10^6$, with the results that the amplitude of a signal voltage across the crystal element will become very large and exceed the withstand voltage of a transistor electrically connected direct to the crystal element, possibly destroying the transistor. The oscillating circuit shown in FIG. 14 includes voltage dividing circuits made up of capacitors connected between resonant element 21 and the input terminal of the differential amplifying circuit or the emitter follower circuit at the input stage of the differential amplifying circuit, for reducing the amplitude of a signal applied to the base of the transistor.

Specifically, the oscillating circuit shown in FIG. 14 is different from the oscillating circuit shown in FIG. 10 in that it additionally includes resistors R9, R10, capacitors C5, C6, and variable capacitors SC3, SC4 as a switched capacitor. Capacitor C5 is connected between node X1 and the base of transistor Q5, which is supplied with bias voltage Vb through resistor R9. The base of transistor Q5 is also connected to an end of variable capacitors C3, whose other end is grounded. Capacitors C5, SC3 jointly make up a variable voltage dividing circuit. Similarly, capacitor C6 is connected between node X2 and the base of transistor Q6, which is supplied with bias voltage Vb through resistor R10. The base of transistor Q6 is also connected to an end of variable capacitors C4, whose other end is grounded. Capacitors C6, SC4 jointly make up a variable voltage dividing circuit. These voltage dividing circuits serve to reduce the amplitude of an input signal applied to the emitter follower circuits and the differential amplifying circuit. Since the capacitance values of variable capacitors SC3, SC4 may be determined depending on the characteristics of resonant element 21, the voltage-controlled oscillating circuit shown in FIG. 14 can be applied to resonant elements 21 of various types and various different resonant frequencies. Each of variable capacitors SC3, SC4 may be of the arrangement shown in FIG. 13, for example.

The oscillating circuit shown in FIG. 14 according to the fourth exemplary embodiment is different from the oscillating circuit shown in FIG. 10 according to the third exemplary embodiment in that it additionally includes resistors R9, R10, capacitors C5, C6, and variable capacitors SC3, SC4 as a switched capacitor. Similarly, resistors R9, R10, capacitors C5, C6, and variable capacitors SC3, SC4 as a switched capacitor may be added to the oscillating circuit shown in FIG. 5 according to the first exemplary embodiment. In such a modification, the junction among capacitors C5, SC3 and resistor R9 is connected to the base of transistor Q1, and the junction among capacitors C6, SC4 and resistor R10 is connected to the base of transistor Q2.

Figure 15:
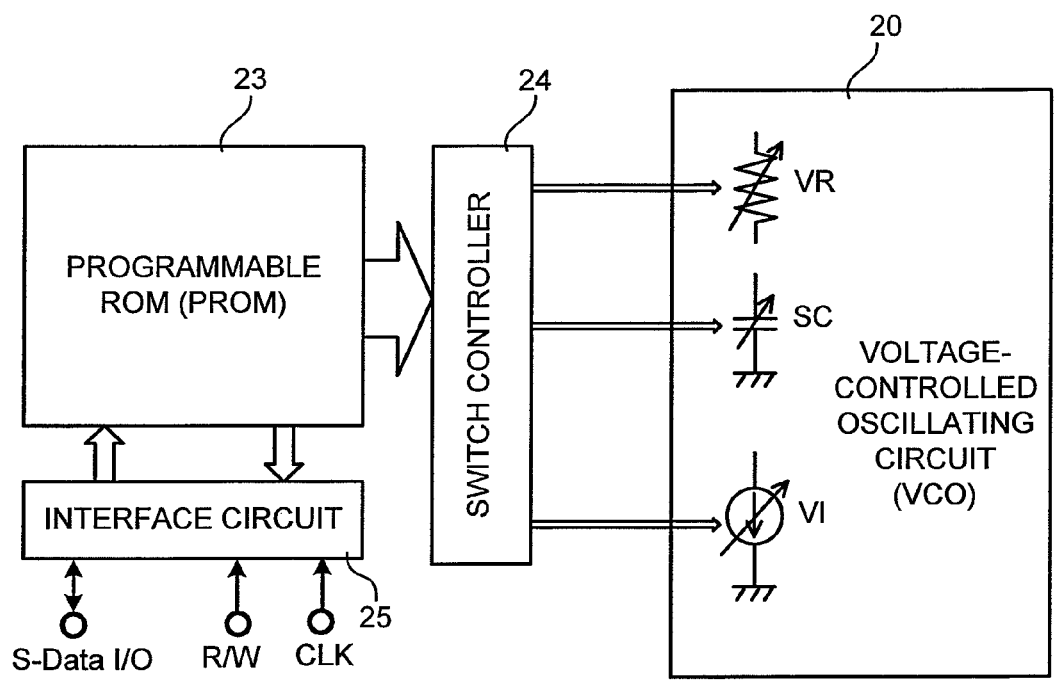
FIG. 15 is a circuit diagram showing configuration of a voltage-controlled oscillating circuit according to a fifth exemplary embodiment of the present invention.

FIG. 15 illustrates a voltage-controlled oscillating circuit according to a fifth exemplary embodiment of the present invention.

The voltage-controlled oscillating circuits shown in FIGS. 10 and 14 make themselves compatible with resonant elements of various types by including variable components in their circuits. However, if signal terminals for controlling those variable components are mounted on an integrated circuit, the chip area of the integrated circuit may become so large that it is not practically feasible. The oscillating circuit shown in FIG. 15 includes programmable PROM (Programmable Read Only Memory) 23 disposed on an integrated circuit with voltage-controlled oscillating circuit (VCO) 20 integrated thereon. In addition, the oscillating circuit includes, in the integrated circuit, switch controller 24 which converts data written in PROM 23 into control signals for the variable components and supplies the control signals to the variable components in voltage-controlled oscillating circuit 20, and interface circuit 25 which writes data into and reads data from PROM 23. Voltage-controlled oscillating circuit 20, PROM 23, switch controller 24, and interface circuit 25 jointly make up a programmable voltage-controlled oscillating circuit. In particular, the variable components in voltage-controlled oscillating circuit 20 include variable resistor VR, variable capacitor SC as a switched capacitor, and variable current source VI. Interface circuit 25, which is provided as a logic circuit, has input and output terminals (S-Data I/O) for writing data into and reading data from PROM 23 in a serial format, a terminal (CLK) for inputting a clock signal, and a terminal (RAN) for inputting a signal that switches between a writing mode and a reading mode.

The circuit which is constructed as shown in FIG. 15 makes it possible to reduce the number of terminals on the integrated circuit, and makes itself applicable to resonant elements 21 of various types and various resonant frequencies by changing the data written in PROM 23. The voltage-controlled oscillating circuit thus constructed can automatically be manufactured.

Voltage-variable capacitors that can be used in the voltage-controlled oscillating circuits according to the above exemplary embodiments will be described below. In particular, voltage-variable capacitors of specific types that are used as variable capacitors VC1 to VC4 in the oscillating circuit shown in FIG. 10 according to the third exemplary embodiments will be described below.

Figure 16:
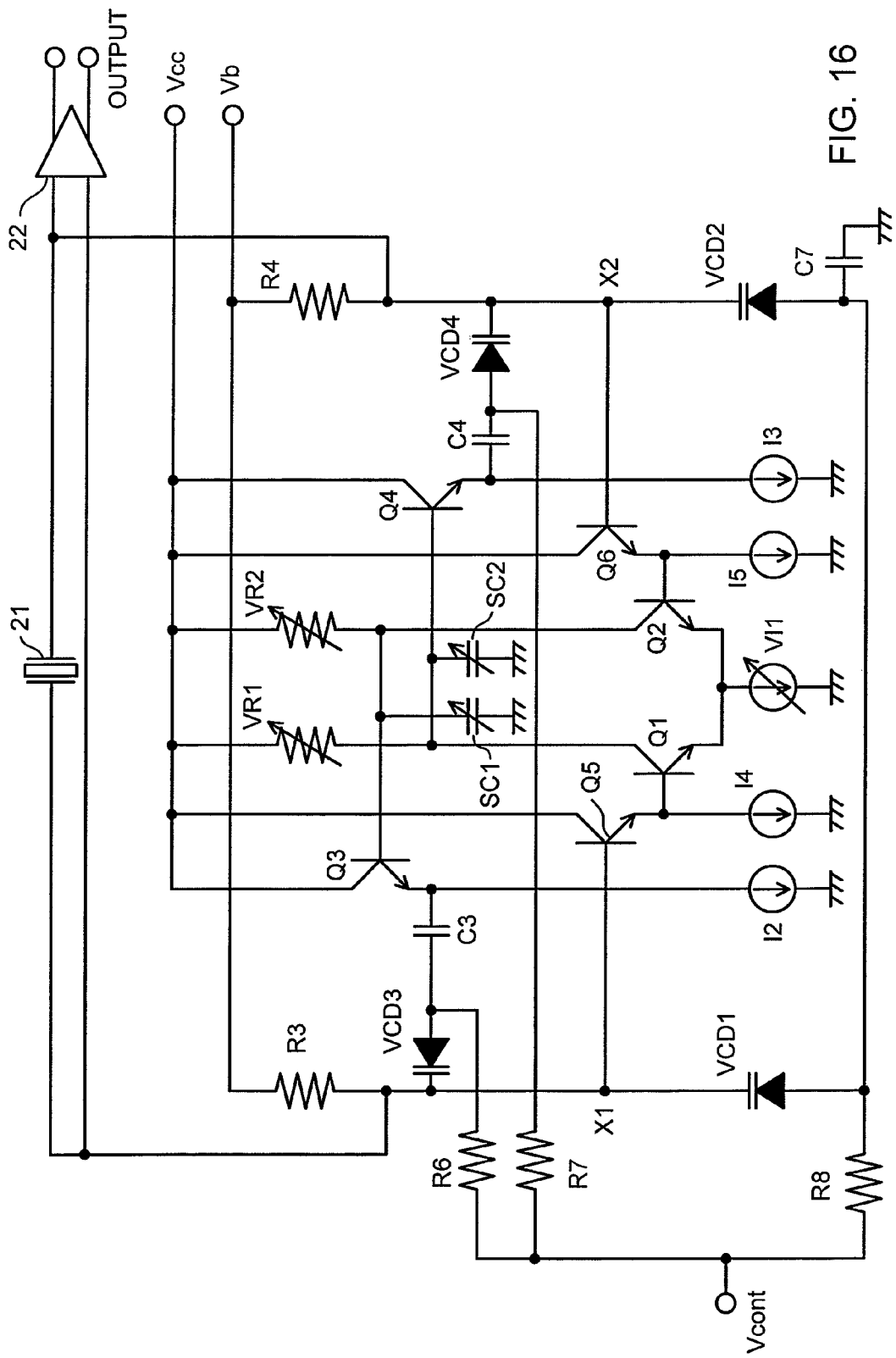
FIG. 16 is a circuit diagram showing an example of the voltage-controlled oscillating circuit shown in FIG. 10 wherein a varactor is used as a voltage-controlled variable capacitor.

A voltage-controlled oscillating circuit shown in FIG. 16 includes varactor diodes VCD1 to VCD4 as respective variable capacitors VC1 to VC4 of the circuit shown in FIG. 10. Cathodes of varactor diodes VCD1, VCD3 are connected in common to node X1, and the cathodes of varactor diodes VCD2, VCD4 are connected in common to node X2. The junction among varactor diodes VCD1, VCD2 and resistor R8 is connected to ground through capacitor C7.

Figure 17:
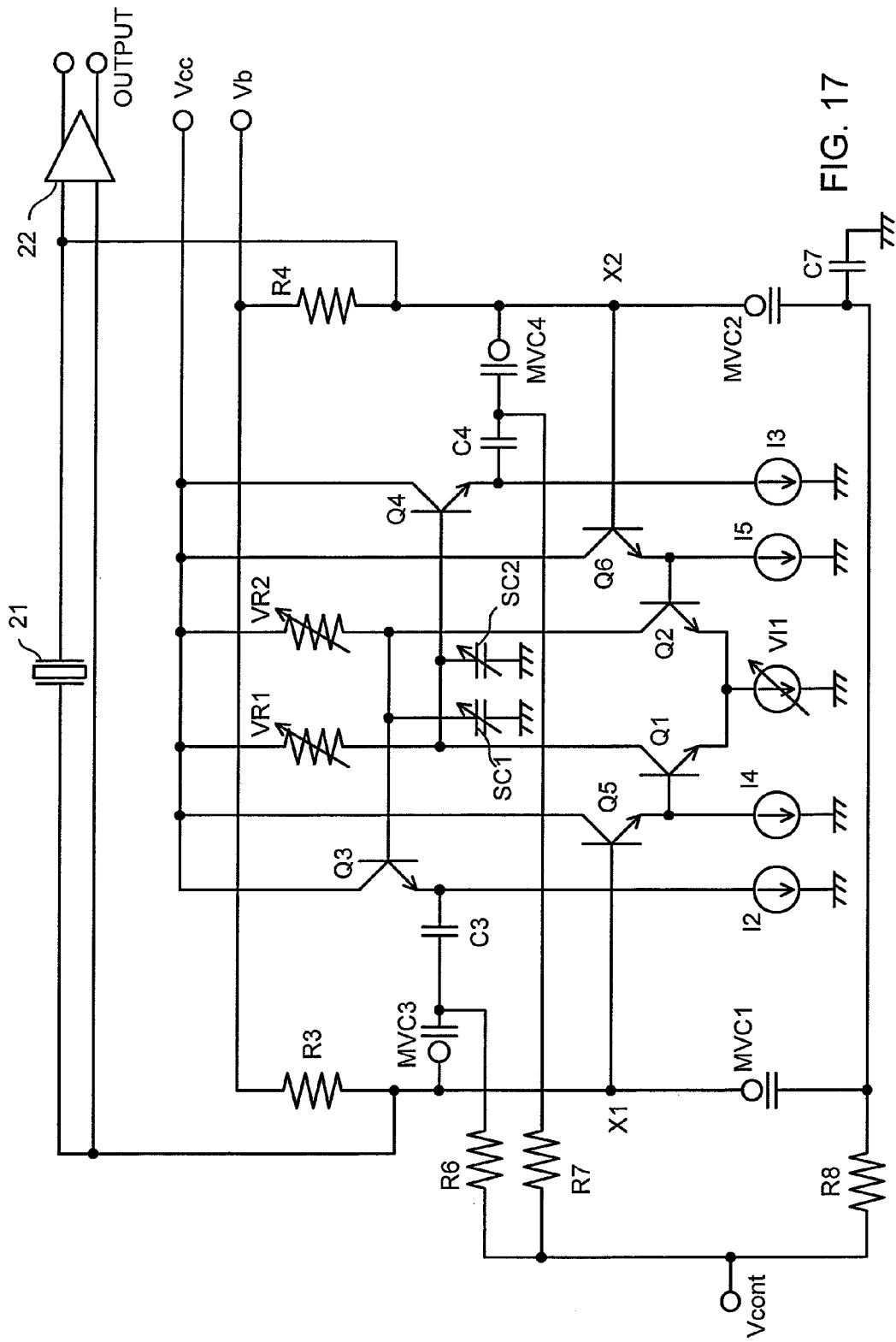
FIG. 17 is a circuit diagram showing an example of the voltage-controlled oscillating circuit shown in FIG. 10 wherein an MOS (Metal-Oxide-Semiconductor) is used as a voltage-controlled variable capacitor.

A voltage-controlled oscillating circuit shown in FIG. 17 includes MOS capacitors MVC1 to MVC4 as respective variable capacitors VC1 to VC4 of the circuit shown in FIG. 10. The gate electrodes of MOS capacitors MVC1, MVC3 are connected in common to node X1, and the gate electrodes of MOS capacitors MVC2, MVC4 are connected in common to node X2. The junction among MOS capacitors MVC1, MVC2 and resistor R8 is connected to ground through capacitor C7.

Figure 18:
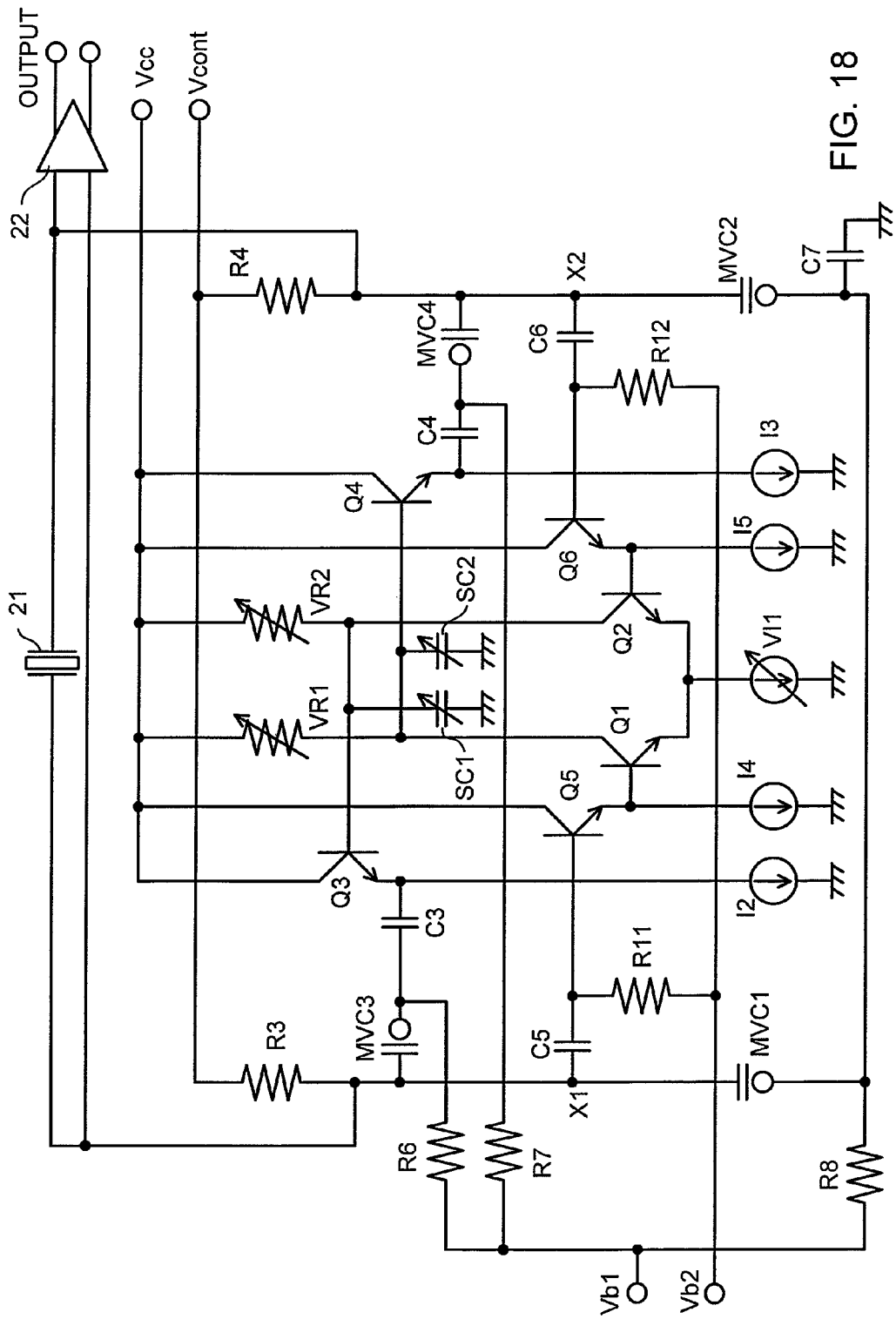
FIG. 18 is a circuit diagram showing another example of the voltage-controlled oscillating circuit shown in FIG. 10 wherein an MOS capacitor is used as a voltage-controlled variable capacitor.

FIG. 18 shows a voltage-controlled oscillating circuit which include inversely connected MOS capacitors MVC1 to MVC4 of the oscillating circuit shown in FIG. 17. With the circuit shown in FIG. 18, since MOS capacitors MVC1 to MVC4 are inversely connected, the polarity of bias voltages applied to these MOS capacitors needs to be inverted. To meet such a need, in the circuit shown in FIG. 18, capacitor C5 is connected between node X1 and the base of transistor Q5, and capacitor C6 is connected between node X2 and the base of transistor Q6. Control voltage Vcont, rather than a bias voltage, is applied to the junction between bias resistors R3, R4, and first bias voltage Vb1, rather than the control voltage, is applied to the junction among resistors R6 to R8. Second bias voltage Vb2 is applied through resistor R11 to the base of transistor Q5 and also through resistor R12 to the base of transistor Q6.

In each of the circuits shown in FIGS. 16 to 18, the junction among two voltage-variable capacitors and resistor R8 is AC-connected to ground through capacitor C7, unlike the oscillating circuits shown in FIG. 10. Capacitor C7 may not necessarily be required. If the voltage applied to the two voltage-variable capacitors is linearly related to the capacitance thereof, then the common junction among two voltage-variable capacitors and resistor R8 serves as a virtually ground point in terms of alternating currents, and is kept at a zero potential at all times with respect AC components. Since the voltage vs. capacitance characteristic of the voltage-variable capacitors is actually nonlinear, however, the common junction does not serve as a virtually ground point in terms of alternating currents, resulting in a deterioration of the phase noise. If the nonlinearity of the voltage-variable capacitors is large, therefore, capacitor C7 is connected between the junction between the voltage-variable capacitors and ground to minimize a deterioration of the phase noise.

Figure 19:
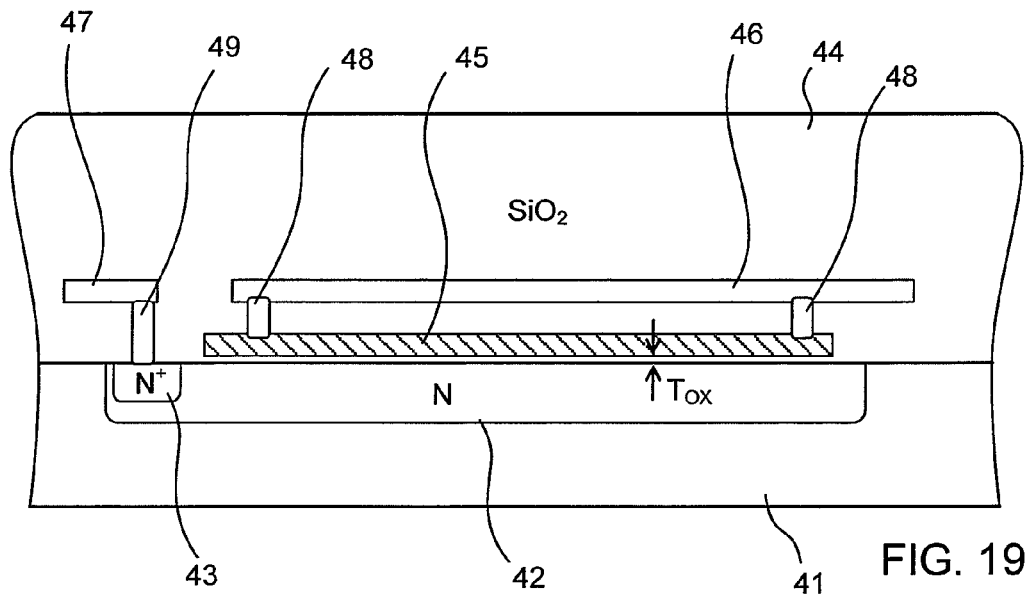
FIG. 19 is a cross-sectional view of an example of structure of the MOS capacitor.
Figure 20:
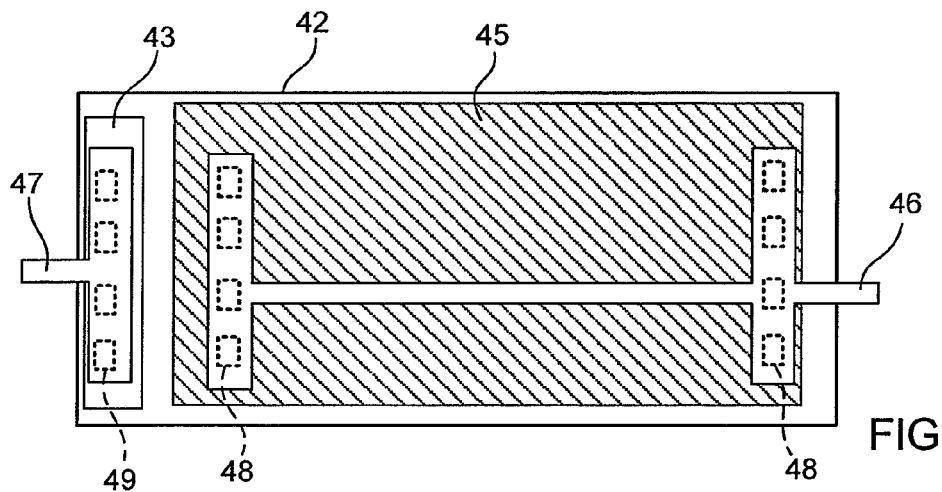
FIG. 20 is a schematic plan view of the MOS capacitor shown in FIG. 19.

FIGS. 19 and 20 show specific structural details of the MOS capacitors included in the voltage-controlled oscillating circuits shown in FIGS. 17 and 18. FIG. 19 is a cross-sectional view of the structure of each of the MOS capacitors, and FIG. 20 is a schematic plan view of the structure with oxide layer 44 omitted from illustration.

As shown FIGS. 19 and 20, the surface of silicon substrate 41 as a semiconductor substrate of an integrated circuit includes N-well region 42 formed by introducing an N-type dopant. N-well region 42 includes electrode connection region 43 in an end thereof which is an $N^+$-region formed by introducing an N-type dopant to a higher concentration level. The region of N-well region 42 other than electrode connection region 43 underlies polysilicon (polycrystalline silicon) electrode 45 with a thin oxide layer interposed therebetween which corresponds to the gate insulating film of a MOSFET. The thickness of the oxide layer between N-well region 42 and polysilicon electrode 45 is indicated by $T_{OX}$. Oxide layer 44 which is made of $SiO_2$ or the like is disposed on silicon substrate 41 in covering relation to N-well region 42, electrode connection region 43, and polysilicon electrode 45. The thin oxide layer interposed between N-well region 42 and polysilicon electrode 45 is part of oxide layer 44.

Oxide layer 44 includes therein interconnect layers 46, 47 which correspond to interlayer interconnect layers of a semiconductor integrated circuit. Interconnect layer 46 is electrically connected to polysilicon electrode 45 through contacts 48, and interconnect layer 47 is electrically connected to electrode connection region 43 through contact 49. Interconnect layer 46 leads from the gate electrode of the MOS capacitor, and interconnect layer 47 leads from the semiconductor substrate.

The voltage-controlled oscillating circuits according to the exemplary embodiments of the present invention wherein a differential amplifying circuit includes a pair of NPN-bipolar transistors and emitter follower circuits are connected to the differential amplifying circuit have been described above. However, the present invention is not limited to those voltage-controlled oscillating circuits, but may be modified in various ways. For example, a voltage-controlled oscillating circuit according to the present invention may include a differential amplifying circuit having N-channel MOS transistors, and may include another follower circuit such as a source follower circuit, instead of the emitter follower circuit.

Figure 21:
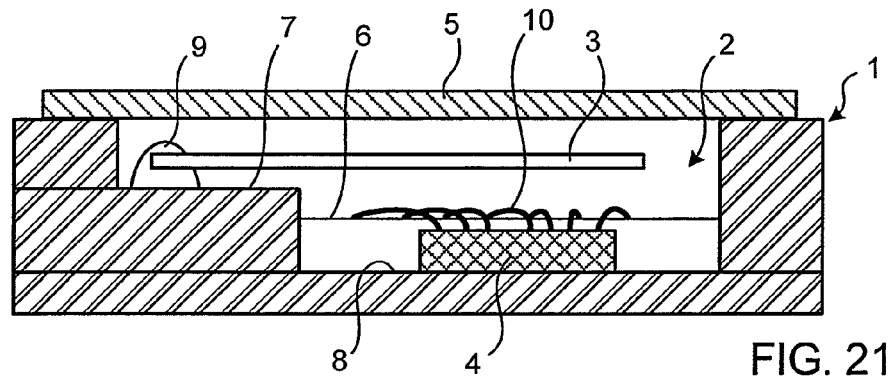
FIG. 21 is a cross-sectional view of an example of structural of a crystal oscillator according to the present invention.

A crystal oscillator which includes a crystal element as the resonant element in any one of the above voltage-controlled oscillating circuits, with all components being unitized into one assembly, will be described below. FIG. 21 shows in cross section a structural example of a crystal oscillator according to the present invention.

The crystal oscillator shown in FIG. 21 lends itself to being surface-mounted on a circuit board or a wiring board. The crystal oscillator includes casing body 1 substantially in the shape of a flat rectangular parallelepiped made of laminated ceramic. Casing body 1 has substantially rectangular recess 2 defined in the principal surface thereof and houses quartz crystal blank 3 and IC (Integrated Circuit) chip 4 in recess 2. Casing body 1 is covered with lid 5 of metal to close recess 2, so that crystal blank 3 and IC chip 4 are hermetically encapsulated in a casing which is constructed of casing body 1 and lid 5. Crystal blank 3 functions as the crystal element. IC chip 4 comprises an electronic circuit integrated on a semiconductor substrate, the electronic circuit including all the components of any one of the above voltage-controlled oscillating circuits, except resonant element 21. The principal surface of IC chip 4 on which the electronic circuit is provided is referred to as a circuit forming surface.

Figure 22:
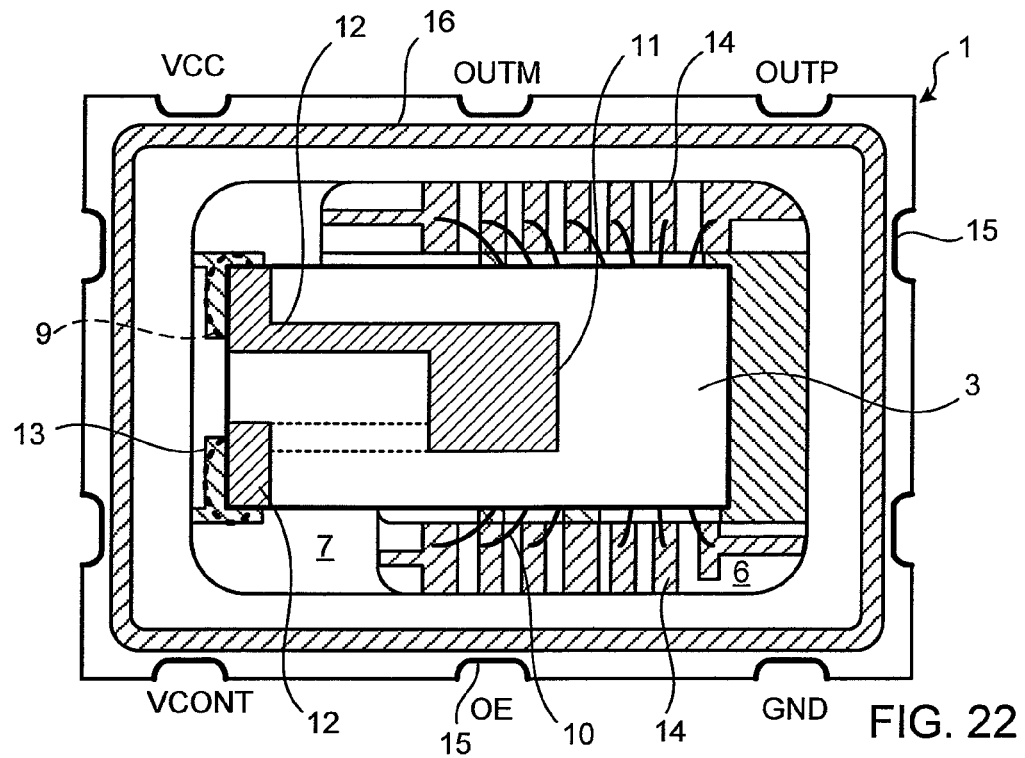
FIG. 22 is a plan view of the crystal oscillator shown in FIG. 21 with a lid omitted from illustration.
Figure 23:
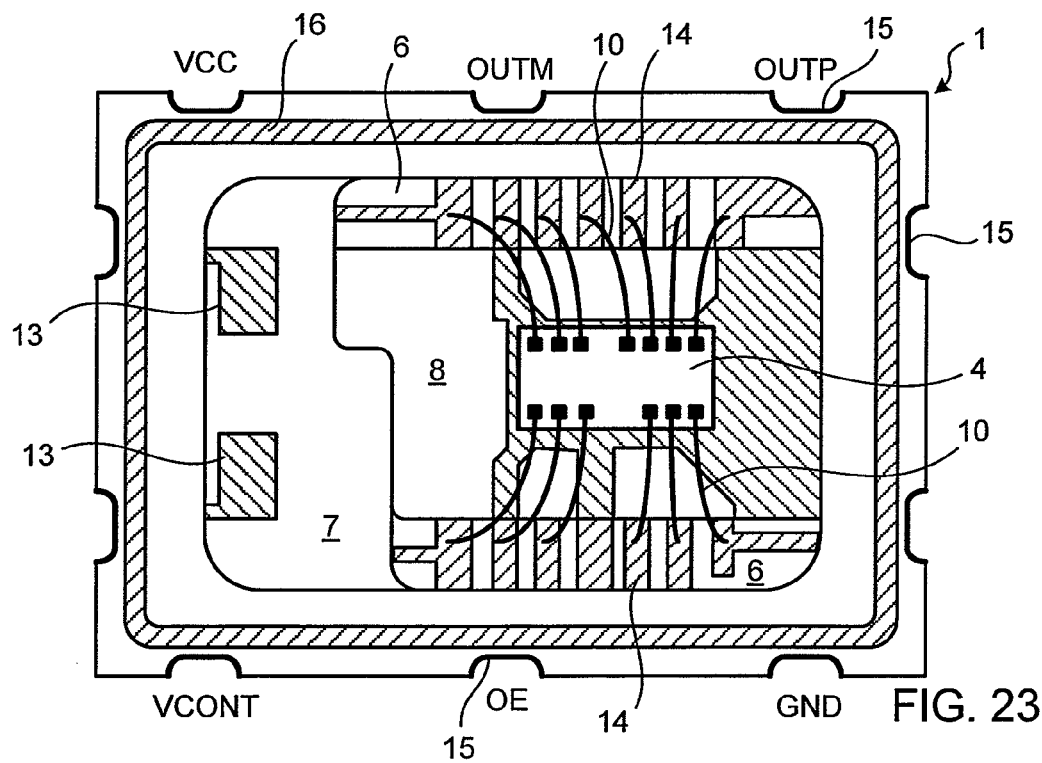
FIG. 23 is a plan view of the crystal oscillator shown in FIG. 21 with the lid and a crystal blank omitted from illustration.

FIG. 22 is a plan view of the crystal oscillator with lid 5 omitted from illustration, and FIG. 23 is a plan view of the crystal oscillator shown in FIG. 21 with lid 5 and crystal blank 3 omitted from illustration. As shown in FIGS. 22 and 23, annular metal film 16 is disposed on the illustrated upper surface of casing body 1 in surrounding relation to recess 2. Metal film 16 is used to join lid 5 to casing body 1.

Crystal blank 3 is, for example, an AT-cut quartz crystal blank which is substantially rectangular in shape. Drive electrodes 11 are disposed centrally on both principal surfaces, respectively, of crystal blank 3. Connection electrodes 12 extend from respective drive electrodes 11 toward respective opposite ends of a shorter side of crystal blank 3. Connection electrodes 12 are folded back between the principal surfaces of crystal blank 3 at the ends of the shorter side of crystal blank 3.

Inner side wall surfaces, which define recess 2, of casing body 1 have two types of steps 6, 7, i.e., first steps 6 and second step 7. First steps 6 are lower than second step 7. First steps 6 extend along opposite longer side wall surfaces of casing body 7, and second step 7 extends along a shorter side wall surface of casing body 7. A plurality of pads (i.e., connection electrodes) 14 for electric connection to IC chip 4 are disposed on the upper surfaces of first steps 6. A pair of holding terminals 13 for electric connection to crystal blank 3 are disposed on the upper surface of second step 7. Holding terminals 13 are electrically connected to two of pads 14 through electrically conductive paths in casing body 1. A plurality of mounting electrodes 15 that are fabricated by castellation on the outer side surfaces of casing body 1. Mounting electrodes 15 are used when the crystal oscillator is surface-mounted on a circuit board or a wiring board. Mounting electrodes 15 are electrically connected to pads 14 through electrically conductive paths in casing body 1. Mounting electrodes 15 include terminal VCC for a power supply voltage, terminals OUTM, OUTP for outputting signals, ground terminal GND, terminal VCONT for receiving a control voltage, terminal OE for inputting an output enable signal, and so on.

IC chip 4 is fixed, with its circuit forming surface facing up, to inner bottom surface 8 of recess 2. Connection pads on the circuit forming surface are electrically connected to pads 14 on first steps 6 with lead wires 10 of gold (Au) or the like by wire bonding. IC chip 4 is thus electrically connected to mounting electrodes 15.

Crystal blank 3 is securely held in recess 2 and electrically connected to IC chip 4 by bonding a pair of connection electrodes 12 to holding terminals 13 by conductive adhesive 9 at the positions on the peripheral of crystal blank 3 toward which a pair of connection electrodes 12 are extracted. Crystal blank 3 thus fixed within recess 2 is positioned above IC chip 4 in covering relation thereto.

The crystal oscillator is completed by securing IC chip 4 to inner bottom surface 8 of recess 2, electrically connecting the connection pads to pads 14 with leads 10 by wire bonding, then fixing crystal blank 3 to holding terminals 13, thereafter joining lid 5 to the upper surface of casing body 1 in surrounding relation to the opening of recess 2, thereby closing recess 2, so that crystal blank 3 and IC chip 4 are hermetically encapsulated in casing body 1.

What is claimed is:

1. A voltage-controlled oscillating circuit for being connected to a resonant element, comprising:
    a first node and a second node for being connected respectively to opposite ends of said resonant element;
    a differential amplifying circuit including first and second input terminals, which constitute a pair of differential input terminals, and first and second output terminals, which constitute a pair of differential output terminals;
    first and second voltage-controlled variable capacitors connected respectively to said first node and said second node;
    first and second load capacitors connected respectively to said first and second output terminals;
    first and second follower circuits, such as emitter follower circuits, connected respectively to said first and second output terminals;
    a first feedback capacitor and a third voltage-controlled variable capacitor which are connected in series to an output terminal of the first follower circuit; and
    a second feedback capacitor and a fourth voltage-controlled variable capacitor which are connected in series to an output terminal of the second follower circuit;
    wherein said first and second nodes are connected respectively to said first and second input terminals, an output signal of the first follower circuit is fed back to said second node through said first feedback capacitor and said third voltage-controlled variable capacitor, an output signal of the second follower circuit is fed back to said first node through said second feedback capacitor and said fourth voltage-controlled variable capacitor, and a control voltage is applied to the first to fourth voltage-controlled variable capacitors.

2. The voltage-controlled oscillating circuit according to claim 1, further comprising:
    a third follower circuit connected between said first node and the first input terminal; and
    a fourth follower circuit connected between said second node and the second input terminal.

3. The voltage-controlled oscillating circuit according to claim 1, further comprising:
    a first variable voltage dividing circuit having a digitally controllable variable capacitance and connected between said first node and the first input terminal; and
    a second variable voltage dividing circuit having a digitally controllable variable capacitor and connected between said second node and the second input terminal.

4. The voltage-controlled oscillating circuit according to claim 2, further comprising:
    a first variable voltage dividing circuit having a variable capacitor digitally controllable by a digital control signal and connected between said first node and an input terminal of said third follower circuit; and
    a second variable voltage dividing circuit having a variable capacitor digitally controllable by a digital control signal and connected between said second node and an input terminal of said fourth follower circuit.

5. The voltage-controlled oscillating circuit according to claim 1, wherein each of a current source of said differential amplifying circuit, load resistors connected respectively to said first and second differential output terminals, and said first and second load capacitors comprises a variable component digitally controllable by a digital control signal.

6. The voltage-controlled oscillating circuit according to claim 4, further comprising:
    a memory circuit to which data supplied from an external circuit is written; and
    a controller generating said digital control signal based on the data written in said memory circuit.

7. The voltage-controlled oscillating circuit according to claim 1, wherein said differential amplifying circuit includes: first and second transistors having respective emitters or collectors connected in common; and a current source connected to a junction between the emitters or the collectors connected in common, output ends of said first and second transistors serving as said first and second output terminals, respectively, and input ends of said first and second transistors serving as said first and second input terminals, respectively.

8. A crystal oscillator comprising:
    a crystal element;
    an IC chip connected to said crystal element; and
    a casing housing said crystal element and said IC chip therein;
    wherein said IC chip includes at least a voltage-controlled oscillating circuit integrated therein which is connected to said crystal element, and
    said voltage-controlled oscillating circuit comprises:
        first and second nodes connected respectively to opposite ends of said resonant element;
        a differential amplifying circuit including first and second input terminals, which constitute a pair of differential input terminals, and first and second output terminals, which constitute a pair of differential output terminals;
        first and second voltage-controlled variable capacitors connected respectively to said first node and said second node;
        first and second load capacitors connected respectively to said first and second output terminals;
        first and second follower circuits connected respectively to said first and second output terminals;

a first feedback capacitor and a third voltage-controlled variable capacitor which are connected in series to an output terminal of the first follower circuit; and a second feedback capacitor and a fourth voltage-controlled variable capacitor which are connected in series to an output terminal of the second follower circuit;

wherein said first and second nodes are connected respectively to said first and second input terminals, an output signal of the first follower circuit is fed back to said second node through said first feedback capacitor and said third voltage-controlled variable capacitor, an output signal of the second follower circuit is fed back to said first node through said second feedback capacitor and said fourth voltage-controlled variable capacitor, and a control voltage is applied to the first to fourth voltage-controlled variable capacitors.

9. The crystal oscillator according to claim 8, wherein said casing includes: a casing body having a recess defined therein; and a lid closing said recess, and a crystal blank functioning as said crystal element and said IC chip are hermetically encapsulated in said recess by said lid.

* * * * *